(12) United States Patent
Chang et al.

(10) Patent No.: US 11,276,620 B2
(45) Date of Patent: Mar. 15, 2022

(54) PACKAGE STRUCTURE AND METHOD FOR MANUFACTURING THE SAME

(71) Applicant: Advanced Semiconductor Engineering, Inc., Kaohsiung (TW)

(72) Inventors: Yung-Shun Chang, Kaohsiung (TW); Teck-Chong Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 57 days.

(21) Appl. No.: 16/730,382

(22) Filed: Dec. 30, 2019

(65) Prior Publication Data
US 2021/0202336 A1  Jul. 1, 2021

(51) Int. Cl.
*H01L 23/31* (2006.01)
*H01L 23/00* (2006.01)
(Continued)

(52) U.S. Cl.
CPC ...... *H01L 23/3128* (2013.01); *H01L 21/4853* (2013.01); *H01L 21/4857* (2013.01); *H01L 21/563* (2013.01); *H01L 21/565* (2013.01); *H01L 23/3135* (2013.01); *H01L 23/49816* (2013.01); *H01L 23/5385* (2013.01); *H01L 23/5386* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 25/16* (2013.01); *H01L 23/3675* (2013.01); *H01L 23/5381* (2013.01); *H01L 2224/16227* (2013.01); *H01L 2224/16238* (2013.01); *H01L 2224/32225* (2013.01); *H01L 2224/73204* (2013.01); *H01L 2224/81193* (2013.01); *H01L 2224/92225* (2013.01); *H01L 2924/19041* (2013.01); *H01L 2924/19102* (2013.01); *H01L 2924/3511* (2013.01); *H01L 2924/3512* (2013.01)

(58) Field of Classification Search
CPC ....... H01L 23/5386; H01L 2224/16238; H01L 2924/19041; H01L 2924/3511; H01L 23/49816; H01L 2224/32225; H01L 2224/73204; H01L 23/3128; H01L 23/3675; H01L 24/73; H01L 23/5385; H01L 21/4853; H01L 21/565; H01L 24/16; H01L 24/92; H01L 2224/81; H01L 2224/193; H01L 24/32; H01L 24/83; H01L 2924/19102; H01L 23/3135; H01L 25/16

See application file for complete search history.

(56) References Cited

U.S. PATENT DOCUMENTS 10,079,157 B2 * 9/2018 Paek ................ H01L 23/49822
10,892,213 B2 * 1/2021 Huang ................ H01L 21/486
2020/0105684 A1 * 4/2020 Chang ................ H01L 23/053

* cited by examiner

*Primary Examiner* — Jasmine J Clark
(74) *Attorney, Agent, or Firm* — Foley & Lardner LLP

(57) ABSTRACT

A package structure includes a wiring structure, at least one electronic device, a reinforcement structure, a plurality of conductive vias and an encapsulant. The wiring structure includes at least one dielectric layer and at least one circuit layer in contact with the dielectric layer. The electronic device is electrically connected to the wiring structure. The reinforcement structure is disposed on a surface of the wiring structure, and includes a thermoset material. The conductive vias is disposed in the reinforcement structure. The encapsulant covers the electronic device.

20 Claims, 23 Drawing Sheets

(51) Int. Cl.
 *H01L 25/16* (2006.01)
 *H01L 23/498* (2006.01)
 *H01L 21/48* (2006.01)
 *H01L 21/56* (2006.01)
 *H01L 23/538* (2006.01)
 *H01L 23/367* (2006.01)

PACKAGE STRUCTURE AND METHOD FOR MANUFACTURING THE SAME

BACKGROUND

1. Field of the Disclosure

The present disclosure relates to a package structure and a manufacturing method, and to a package structure including a reinforcement structure, and a method for manufacturing the same.

2. Description of the Related Art

Along with the rapid development in electronics industry and the progress of semiconductor processing technologies, semiconductor package structures are integrated with an increasing number of electronic components or electronic devices to achieve improved electrical performance and additional functions. Accordingly, a warpage of the semiconductor package structure may occur during the thermal process. Since a rigidity or stiffness of the semiconductor package structure is relatively low, a crack may be formed at the top surface of the semiconductor package structure and extend or grow into the interior of the semiconductor package structure. If the crack reaches the semiconductor package structure, the circuit layer in the semiconductor package structure may be damaged or broken, which may result in an open circuit and render the semiconductor package structure inoperative. Thus, a yield of the semiconductor assembly structure may decrease.

SUMMARY

In some embodiments, a package structure includes a wiring structure, at least one electronic device, a reinforcement structure, a plurality of conductive vias and an encapsulant. The wiring structure includes at least one dielectric layer and at least one circuit layer in contact with the dielectric layer. The electronic device is electrically connected to the wiring structure. The reinforcement structure is disposed on a surface of the wiring structure, and includes a thermoset material. The conductive vias is disposed in the reinforcement structure. The encapsulant covers the electronic device.

In some embodiments, a manufacturing method includes: (a) providing a wiring structure, wherein the wiring structure includes at least one dielectric layer and at least one circuit layer in contact with the dielectric layer; (b) forming a reinforcement structure on the wiring structure, wherein the reinforcement structure includes a plurality of conductive vias disposed therein; and (c) electrically connecting at least one electronic device to the conductive vias of the reinforcement structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
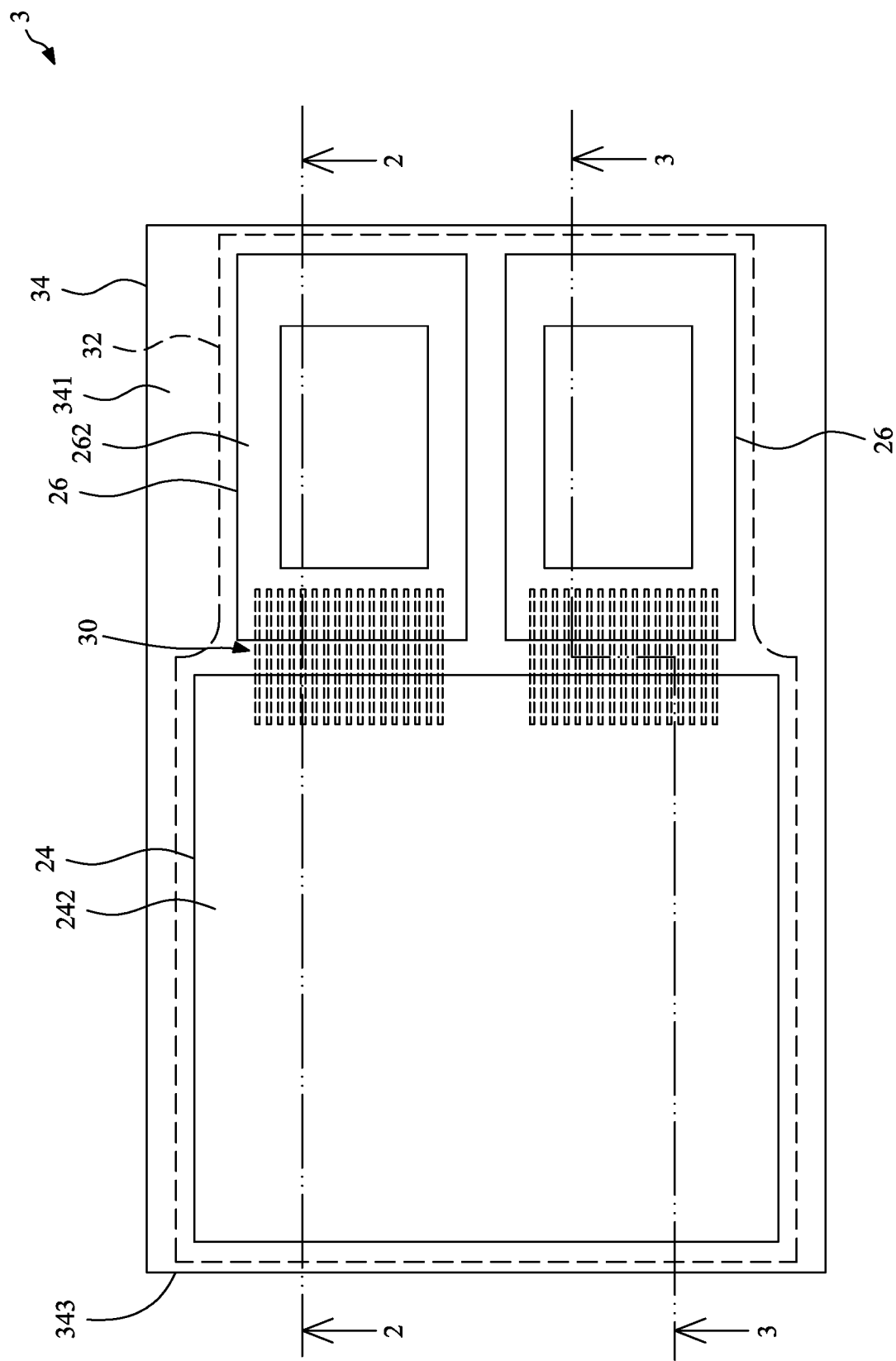
FIG. 1 illustrates a top view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a package structure which has an improved crack resistance so as to improve a reliability or a yield thereof. At least some embodiments of the present disclosure further provide for techniques for manufacturing the package structure and an assembly structure.

Figure 2:
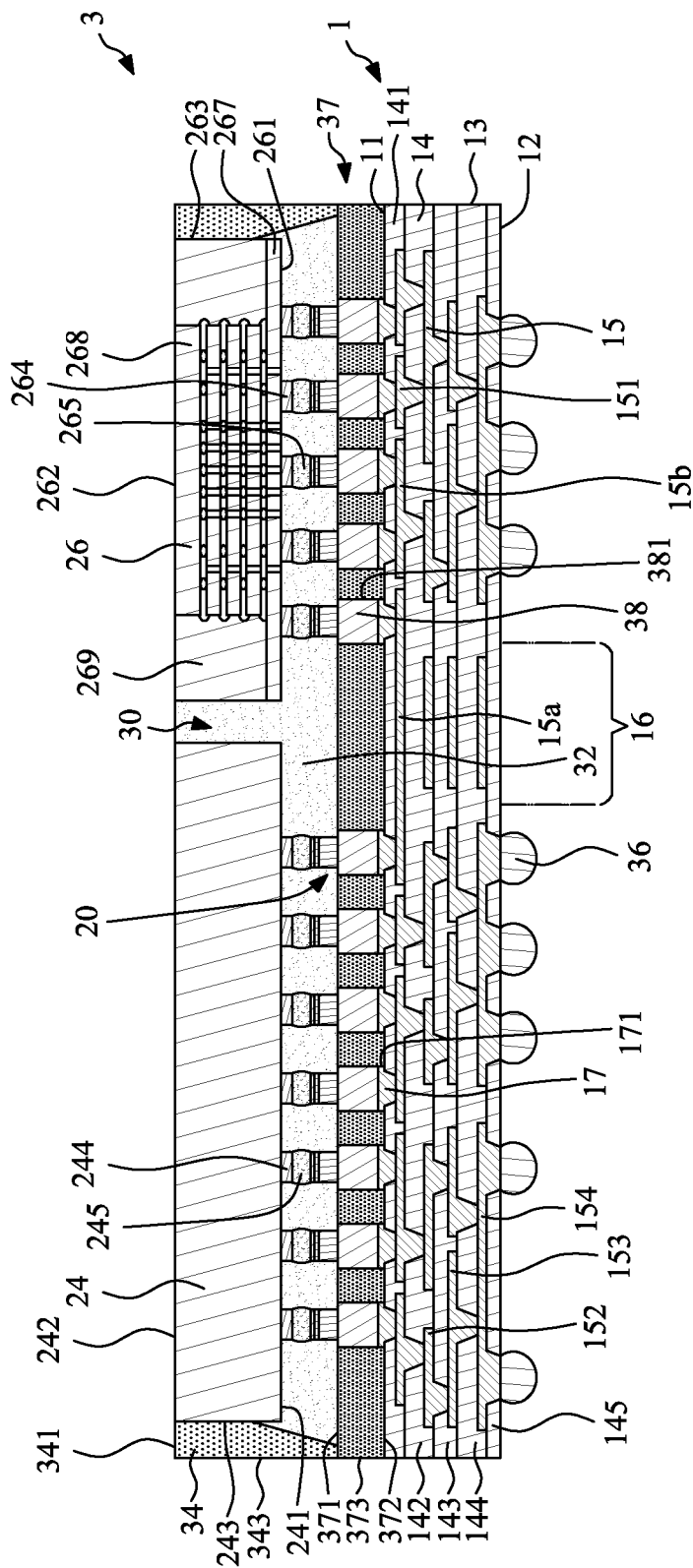
FIG. 2 illustrates a cross-sectional view taken along line 2-2 of the package structure of FIG. 1.
Figure 3:
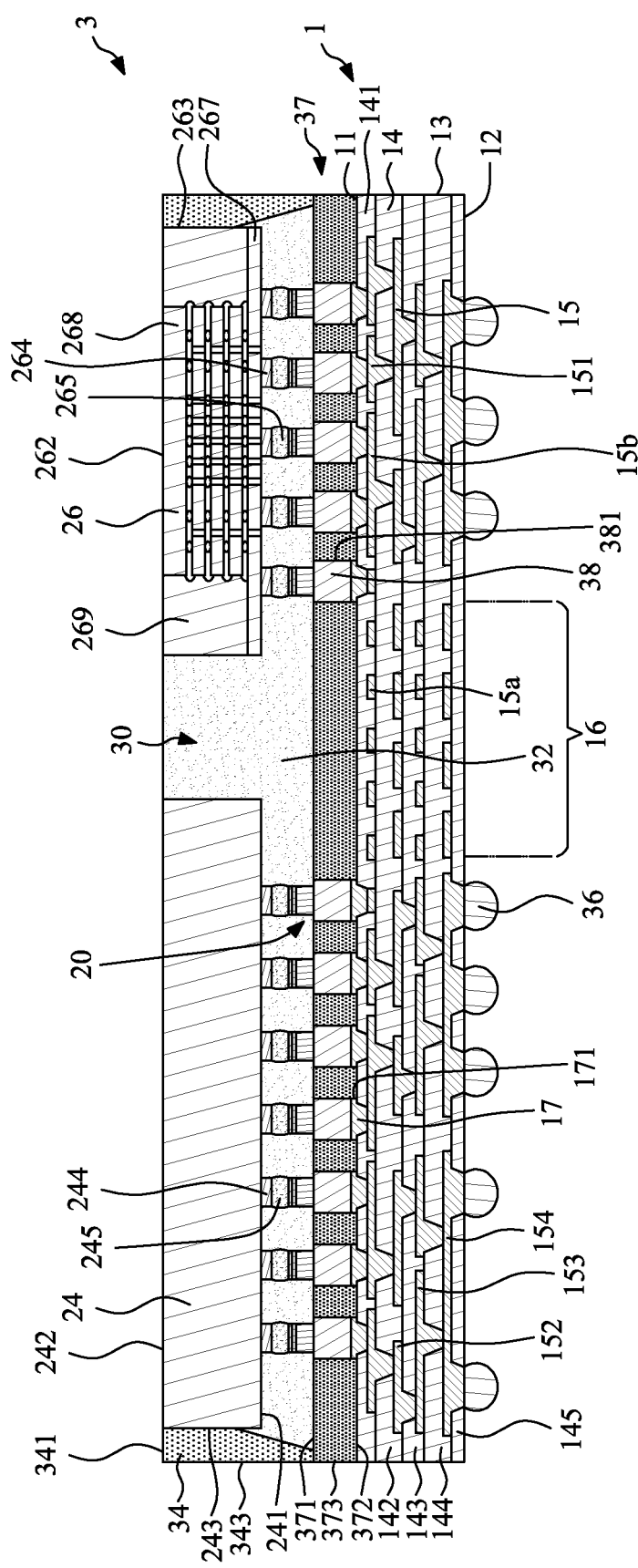
FIG. 3 illustrates a cross-sectional view taken along line 3-3 of the package structure of FIG. 1.

FIG. 1 illustrates a top view of a package structure 3 according to some embodiments of the present disclosure. FIG. 2 illustrates a cross-sectional view taken along line 2-2 of the package structure 3 of FIG. 1. FIG. 3 illustrates a cross-sectional view taken along line 3-3 of the package structure 3 of FIG. 1. The package structure 3 includes a wiring structure 1, a plurality of conductive vias 38, a reinforcement structure 37, a plurality of conductive bumps 20, a first electronic device 24, a second electronic device 26, a protection material 32, an encapsulant 34 and a plurality of solder materials 36. As shown in FIG. 1, the package structure 3 may include one first electronic device 24 and two second electronic devices 26. However, the amounts of the first electronic device(s) 24 and the second electronic device(s) 26 are not limited in the present disclosure.

As shown in FIG. 2 and FIG. 3, the wiring structure 1 has a first surface 11, a second surface 12 opposite to the first surface 11, a lateral surface 13 extending between the first surface 11 and the second surface 12, and a high density region 16 (or a fine line region) between the first electronic device 24 and the second electronic device 26. The wiring structure 1 may include at least one dielectric layer 14, at least one circuit layer 15 in contact with the dielectric layer 14, and a plurality of protrusion pads 17. For example, as shown in FIG. 2 and FIG. 3, the wiring structure 1 includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145. That is, the at least one dielectric layer 14 includes the first dielectric layer 141, the second dielectric layer 142, the third dielectric layer 143, the fourth dielectric layer 144 and the fifth dielectric layer 145. The at least one circuit layer 15 includes the first circuit layer 151, the second circuit layer 152, the third circuit layer 153 and the fourth circuit layer 154.

The first dielectric layer 141 may be a topmost dielectric layer or an outermost dielectric layer of the wiring structure 1. The first circuit layer 151 may be a topmost circuit layer or an outermost circuit layer of the wiring structure 1. A material of the first circuit layer 151 may include, for example, copper, another conductive metal, or an alloy thereof. A material of the first dielectric layer 141 may include an insulating material, a passivation material, a dielectric material or a solder resist material, such as, for example, a benzocyclobutene (BCB) based polymer or a polyimide (PI). In some embodiments, the first dielectric layer 141 may be made of a photoimageable material. In addition, the first surface 11 of the wiring structure 1 may be a top surface of the first dielectric layer 141. The first circuit layer 151 is disposed adjacent to the top surface of the first dielectric layer 141. In some embodiments, the first circuit layer 151 is embedded in the first dielectric layer 141, and is exposed from the top surface of the first dielectric layer 141. That is, the first dielectric layer 141 covers the first circuit layer 151, and defines a plurality of openings to expose portions of the first circuit layer 151.

Further, the first circuit layer 151 may include an interconnection portion 15a and a periphery portion 15b. The interconnection portion 15a is located in the high density region 16, and the periphery portion 15b is located outside the high density region 16 (e.g., a low density region). For example, the second electronic device 26 may be electrically connected to the first electronic device 24 through the interconnection portion 15a of the first circuit layer 151. The second electronic device 26 and the first electronic device 24 may be electrically connected to the solder materials 36 on the second surface 12 of the wiring structure 1 through the periphery portion 15b of the first circuit layer 151. A line width/line space (L/S) of the traces of the interconnection portion 15a may be less than an L/S of the traces of the periphery portion 15b. For example, an L/S of the traces of the interconnection portion 15a may be less than or equal to about 5 µm/about 5 µm, or less than or equal to about 2 µm/about 2 µm, or less than or equal to about 0.8 µm/about 0.8 µm. An L/S of the traces of the periphery portion 15b may be less than or equal to about 10 µm/about 10 µm, or less than or equal to about 7 µm/about 7 µm, or less than or equal to about 5 µm/about 5 µm.

The first dielectric layer 141 and the first circuit layer 151 may be disposed on the second dielectric layer 142. In addition, the second dielectric layer 142 may cover the second circuit layer 152. A portion (e.g., a via portion) of the first circuit layer 151 extends through the second dielectric layer 142 to electrically connect the second circuit layer 152. A material of the second dielectric layer 142 may be the same as or similar to the material of the first dielectric layer 141. The second circuit layer 152 may also include an interconnection portion located in the high density region 16, and a periphery portion located outside the high density region 16. In some embodiments, the via portion of the first circuit layer 151 may extend from the periphery portion, and they may be formed concurrently and integrally.

Similarly, the second dielectric layer 142 and the second circuit layer 152 may be disposed on the third dielectric layer 143. In addition, the third dielectric layer 143 may cover the third circuit layer 153. A portion (e.g., a via portion) of the second circuit layer 152 extends through the third dielectric layer 143 to electrically connect the third circuit layer 153. A material of the third dielectric layer 143 may be the same as or similar to the material of the second dielectric layer 142. The third circuit layer 153 may also include an interconnection portion located in the high density region 16, and a periphery portion located outside the high density region 16. In some embodiments, the via portion of the second circuit layer 152 may extend from the periphery portion, and they may be formed concurrently and integrally.

Similarly, the third dielectric layer 143 and the third circuit layer 153 may be disposed on the fourth dielectric layer 144. In addition, the fourth dielectric layer 144 may cover the fourth circuit layer 154. A portion (e.g., a via portion) of the third circuit layer 153 extends through the fourth dielectric layer 144 to electrically connect the fourth circuit layer 154. A material of the fourth dielectric layer 144 may be the same as or similar to the material of the third dielectric layer 143. The fourth circuit layer 154 may also include an interconnection portion located in the high density region 16, and a periphery portion located outside the high density region 16.

The fourth dielectric layer 144 and the fourth circuit layer 154 may be disposed on the fifth dielectric layer 145. A portion (e.g., a via portion) of the fourth circuit layer 154 extends through the fifth dielectric layer 145 to be exposed from a bottom surface of the fifth dielectric layer 145 (e.g., the second surface 12 of the wiring structure 1). A material of the fifth dielectric layer 145 may be the same as or similar to the material of the fourth dielectric layer 144. As shown in FIG. 2 and FIG. 3, the second electronic device 26 may be electrically connected to the first electronic device 24 through the interconnection portion 15a of the circuit layer 15 (including, for example, the interconnection portions 15a of the first circuit layer 151, the second circuit layer 152, the third circuit layer 153 and the fourth circuit layer 154). The second electronic device 26 and the first electronic device 24 may be electrically connected to the solder materials 36 through the via portions of the periphery portion 15b of the circuit layer 15 (including, for example, the periphery portions 15b of the first circuit layer 151, the second circuit layer 152, the third circuit layer 153 and the fourth circuit layer 154).

The protrusion pads 17 may be disposed on and protrude from the first dielectric layer 141 (e.g., the topmost dielectric layer or the outermost dielectric layer) of the wiring structure 1. The protrusion pads 17 may be disposed on and protrude from the first surface 11 of the wiring structure 1, and extend through the first dielectric layer 141 (e.g., the topmost dielectric layer or the outermost dielectric layer) to electrically connect the first circuit layer 151. As shown in FIG. 2 and FIG. 3, each of the protrusion pads 17 may include a periphery side surface 171.

The conductive vias 38 (or conductive pillars) are disposed on the protrusion pads 17. Each of the conductive vias 38 may have a periphery side surface 381. In some embodiments, the periphery side surface 381 of the conductive via 38 may be substantially coplanar with the periphery side surface 171 of the protrusion pad 17.

The reinforcement structure 37 may be disposed on the first surface 11 of the wiring structure 1 to cover the periphery side surface 381 of the conductive via 38 and the periphery side surface 171 of the protrusion pad 17. The reinforcement structure 37 may have a first surface 371, a second surface 372 opposite to the first surface 371, and a lateral surface 373 extending between the first surface 371 and the second surface 372. A Young's modulus of the reinforcement structure 37 is greater than a Young's modulus of the wiring structure 1. For example, the Young's modulus of the reinforcement structure 37 may be in a range of about 15 GPa to about 29 GPa. In some embodiments, a stress index is defined as a product of the Young's modulus and a coefficient of thermal expansion (CTE). The stress index of the reinforcement structure 37 is greater than the stress index of the wiring structure 1. For example, the stress index of the reinforcement structure 37 may be in a range of about 136 to about 233.

In some embodiments, the reinforcement structure 37 may include a thermoset material such as a thermoset polymer. In some embodiments, the reinforcement structure 37 may be a molding compound. The molding compound may include a resin material with or without fillers, and may be formed by a molding process and a curing process. The second surface 372 of the reinforcement structure 37 may contact the first surface 11 of the wiring structure 1 directly, and may be lower than the top surface of the protrusion pad 17. That is, the conductive via 38 and at least a portion of the protrusion pad 17 may be disposed or embedded in the reinforcement structure 37.

The top surfaces of the conductive vias 38 may be substantially coplanar with the first surface 371 of the reinforcement structure 37. Thus, the top surfaces of the conductive vias 38 may be exposed from the first surface 371 of the reinforcement structure 37. In addition, a size of the reinforcement structure 37 may be substantially equal to a size of the wiring structure 1 from a top view since the may be cut concurrently. Further, the lateral surface 373 of the reinforcement structure 37 may be substantially coplanar with the lateral surface 13 of the wiring structure 1. In some embodiments, a size of the reinforcement structure 37 substantially covers the wiring structure 1 from a top view.

The conductive bumps 20 may be disposed on and protrude from the first surface 371 of the reinforcement structure 37. In some embodiments, the conductive bumps 20 may be disposed on and electrically connected to the top surfaces of the conductive vias 38. In some embodiments, the conductive bump 20 may include a first metal layer, a second metal layer and a third metal layer sequentially disposed on the top surface of the conductive via 38. For example, the first metal layer may include copper, the second metal layer may include nickel, and the third metal layer may include gold.

The first electronic device 24 and the second electronic device 26 are disposed adjacent to the first surface 371 of the reinforcement structure 37 side by side, and are electrically connected to the circuit layer 15 of the wiring structure 1. The first electronic device 24 may be a semiconductor device such as an application specific integrated circuit (ASIC) die. As shown in FIG. 2 and FIG. 3, the first electronic device 24 may have a first active surface 241, a first backside surface 242 opposite to the first active surface 241, and a lateral surface 243 extending between the first active surface 241 and the first backside surface 242. Further, the first electronic device 24 may include a plurality of first electrical contacts 244 disposed adjacent to the first active surface 241. The first electrical contacts 244 may be exposed or may protrude from the first active surface 241 for electrical connection. The first electrical contacts 244 may be pads, bumps, studs, pillars or posts. In some embodiments, the first electrical contacts 244 of the first electronic device 24 may be electrically connected and bonded to the conductive bumps 20 through a plurality of solder materials 245. In other words, the first electronic device 24 may be bonded to the reinforcement structure 37 by flip-chip bonding. For example, the first electrical contacts 244 may include copper, gold, platinum, and/or other suitable material.

The second electronic device 26 may be a semiconductor device such as high bandwidth memory (HBM) die. As shown in FIG. 2 and FIG. 3, the second electronic device 26 may have a second active surface 261, a second backside surface 262 opposite to the second active surface 261, and a lateral surface 263 extending between the second active surface 261 and the second backside surface 262. Further, the second electronic device 26 may include a plurality of second electrical contacts 264 disposed adjacent to the second active surface 261. The second electrical contacts 264 may be exposed or may protrude from the second active surface 261 for electrical connection. The second electrical contacts 264 may be pads, bumps, studs, pillars or posts. In some embodiments, the second electrical contacts 264 of the second electronic device 26 may be electrically connected and bonded to the conductive bumps 20 through a plurality of solder materials 265. In other words, the second electronic device 26 may be bonded to the reinforcement structure 37 by flip-chip bonding. For example, the second electrical contact 264 may include copper, gold, platinum, and/or other suitable material. As shown in FIG. 2 and FIG. 3, the second electronic device 26 may include a substrate 267, a plurality of memory dice 268 and an encapsulant 269. The memory dice 268 may be stacked on the substrate 267. The encapsulant 269 may cover the substrate 267 and the memory dice 268. As shown in FIG. 2 and FIG. 3, the first electronic device 24 and the second electronic device 26 may be electrically connected to the wiring structure 1 through the conductive vias 38 in the reinforcement structure 37.

The protection material 32 (e.g., an underfill) may be disposed in a space between the first electronic device 24 and the reinforcement structure 37 so as to cover and protect the joints formed by the first electrical contacts 244, the conductive bumps 20 and the solder materials 245. Further, the protection material 32 may be disposed in a space between the second electronic device 26 and the reinforcement structure 37 so as to cover and protect the joints formed by the second electrical contacts 264, the conductive bumps 20 and the solder materials 265. In addition, the protection material 32 may further extend into a gap 30 between the lateral surface 243 of the first electronic device 24 and the lateral surface 263 of the second electronic device 26. The protection material 32 (e.g., an underfill) may contact the reinforcement structure 37 directly.

The encapsulant 34 covers at least a portion of the first surface 371 of the reinforcement structure 37, at least a portion of the first electronic device 24, at least a portion of the second electronic device 26 and the protection material 32. A material of the encapsulant 34 may be a molding compound with or without fillers. The material of the main material 374 may be the same as or different from the material of the encapsulant 34. The encapsulant 34 has a first surface 341 (e.g., a top surface) and a lateral surface 343. As shown in FIG. 2 and FIG. 3, the first surface 341 of the encapsulant 34, the first backside surface 242 of the first electronic device 24 and the second backside surface 262 of the second electronic device 26. In some embodiments, the top surface of the protection material 32 in the gap 30 may be recessed from the first backside surface 242 of the first electronic device 24 and/or the second backside surface 262 of the second electronic device 26. Thus, a portion of the encapsulant 34 may extend into the gap 30 between the first electronic device 24 and the second electronic device 26. In addition, the lateral surface 343 of the encapsulant 34 may be substantially coplanar with the lateral surface 13 of the wiring structure 1 and the lateral surface 373 of the reinforcement structure 37.

The solder materials 36 (e.g., solder balls) may be disposed adjacent to the second surface 12 of the wiring structure 1 for external connection. As shown in FIG. 2 and FIG. 3, the solder materials 36 are disposed on the exposed portions (e.g., the bottom portions of the via portions) of the fourth circuit layer 154.

In the embodiment illustrated in FIG. 1 to FIG. 3, the reinforcement structure 37 may increase the rigidity or stiffness of the wiring structure 1 and the package structure 3 so as to reduce a warpage of the wiring structure 1 and the package structure 3. Thus, the risk of formation of crack in the protection material 32 or the encapsulant 34 is low. In addition, if a crack is formed at the top surface of the protection material 32 in the gap 30 and extend or grow downward, it will be stopped by the reinforcement structure 37. Thus, the reinforcement structure 37 may prevent the crack from reaching the wiring structure 1, and may protect the interconnection portion 15a of the circuit layer 15 from being damaged or broken. Therefore, the reliability and yield of the package structure 3 is improved. In addition, the material of the reinforcement structure 37 may be polymer such as resin, which is cheaper than a silicon interposer or a glass interposer. Therefore, the cost of the package structure 3 is reduced.

Figure 4:
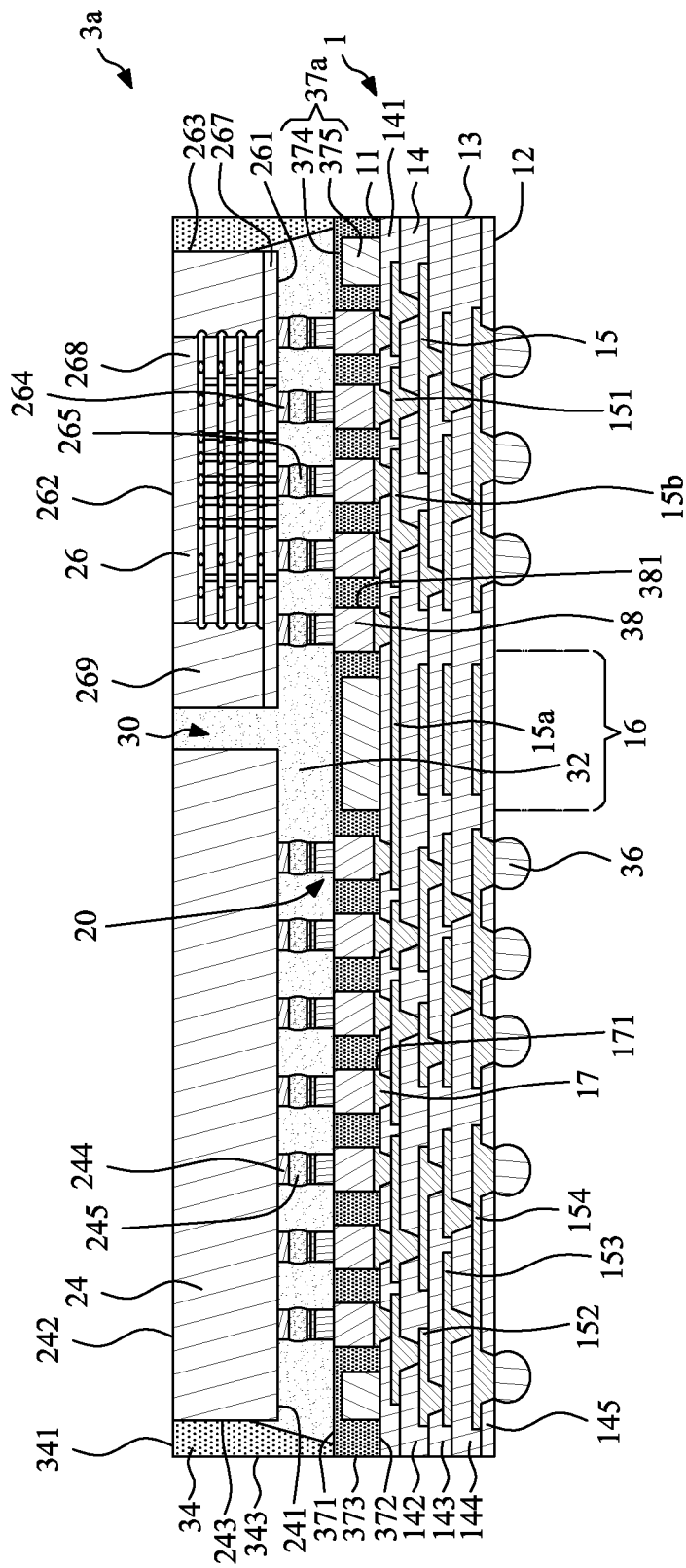
FIG. 4 illustrates a cross-sectional view of an example of a package structure according to some embodiments of the present disclosure.

FIG. 4 illustrates a cross-sectional view of an example of a package structure 3a according to some embodiments of the present disclosure. The package structure 3a of FIG. 4 is similar to the package structure 3 of FIG. 1 to FIG. 3, except for a structure of the reinforcement structure 37a. As shown in FIG. 4, the reinforcement structure 37a may include a main material 374 and at least one embedded element 375 embedded in the main material 374. The main material 374 may be similar to the reinforcement structure 37 of FIG. 2 and FIG. 3, and may be a thermoset material such as a thermoset polymer. In some embodiments, the main material 374 may be a molding compound including a resin material with or without fillers, and may be formed by a molding process and a curing process. The at least one embedded element 375 may be disposed on the first surface 11 of the wiring structure 1, and may be covered by the main material 374. That is, the at least one embedded element 375 may not extend through the main material 374. In some embodiments, a material of the at least one embedded element 375 may be a dummy bulk including a silicon material or glass material. A Young's modulus or a stress index of the at least one embedded element 375 is greater than a Young's modulus or a stress index of the main material 374 so as to increase a Young's modulus or a stress index of the reinforcement structure 37a.

Figure 5:
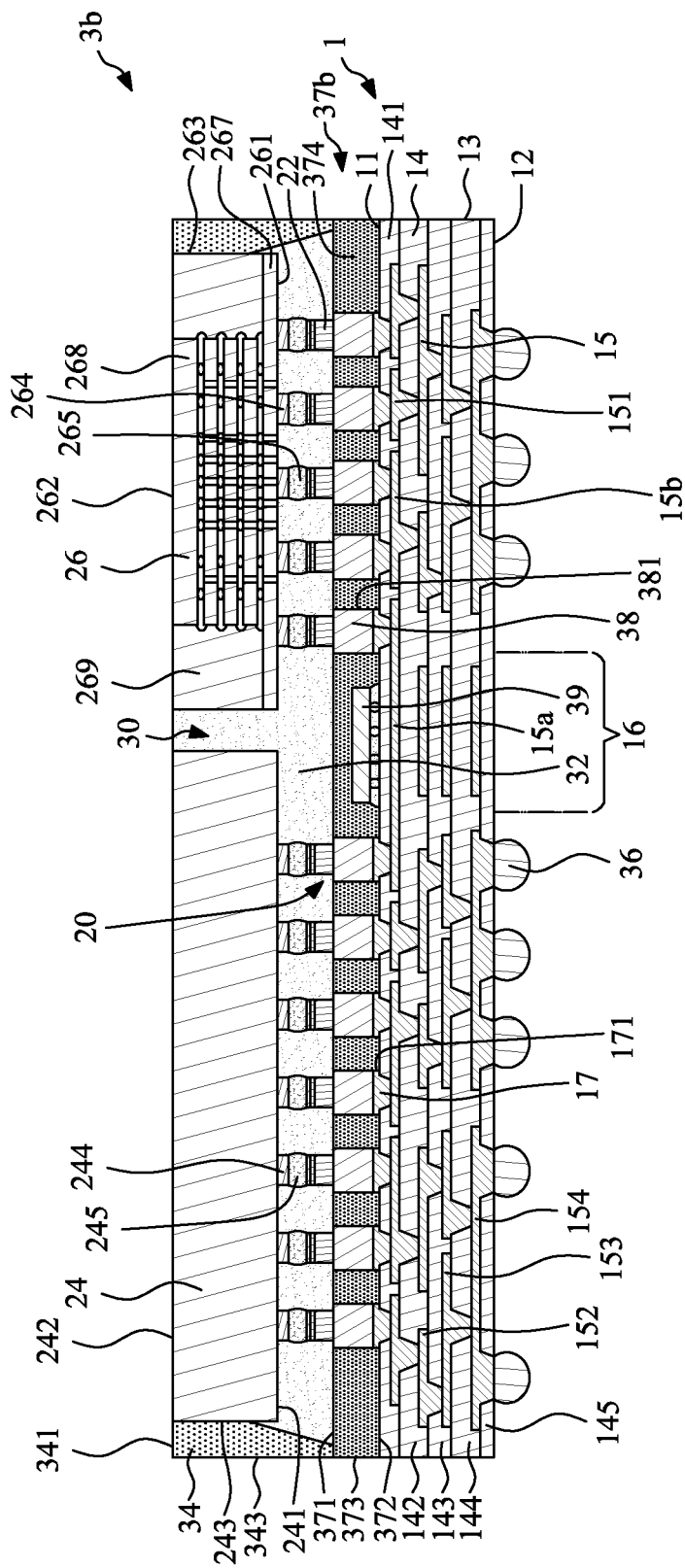
FIG. 5 illustrates a cross-sectional view of an example of a package structure according to some embodiments of the present disclosure.

FIG. 5 illustrates a cross-sectional view of an example of a package structure 3b according to some embodiments of the present disclosure. The package structure 3b of FIG. 5 is similar to the package structure 3a of FIG. 4, except for a structure of the reinforcement structure 37b. As shown in FIG. 5, the reinforcement structure 37b may include a main material 374 and at least one embedded element (e.g., a passive device 39) embedded in the main material 374. The main material 374 of FIG. 5 may be similar to the main material 374 of FIG. 4. The at least one passive device 39 (e.g., a capacitor) may be covered by the main material 374. As shown in FIG. 5, the at least one passive device 39 (e.g., a capacitor) may be disposed on and electrically connected to the first surface 11 of the wiring structure 1.

Figure 6:
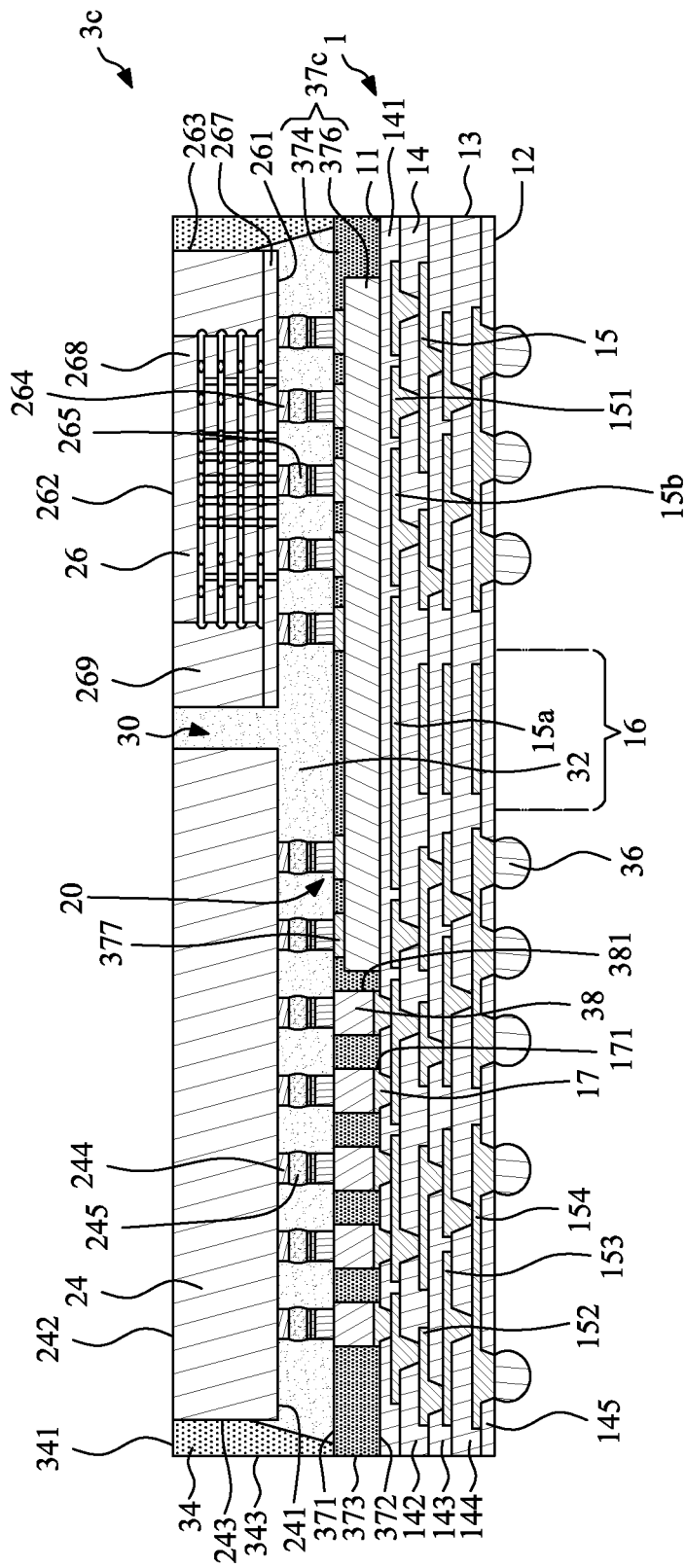
FIG. 6 illustrates a cross-sectional view of an example of a package structure according to some embodiments of the present disclosure.

FIG. 6 illustrates a cross-sectional view of an example of a package structure 3c according to some embodiments of the present disclosure. The package structure 3c of FIG. 6 is similar to the package structure 3a of FIG. 4, except for a structure of the reinforcement structure 37c. As shown in FIG. 6, the reinforcement structure 37c may include a main material 374 and at least one embedded element (e.g., a bridge die 376) embedded in the main material 374. The main material 374 of FIG. 6 may be similar to the main material 374 of FIG. 4. The at least one bridge die 376 may be covered by the main material 374. As shown in FIG. 6, the at least one bridge die 376 may be attached to the first surface 11 of the wiring structure 1. In some embodiments, the bridge die 376 may include a plurality of electrical contacts 377 disposed adjacent to the top surface of the bridge die 376. The top surfaces of the electrical contacts 377 may be substantially coplanar with and/or exposed from the top surface of the main material 374 (e.g., the first surface 371 of the reinforcement structure 37*c*). The electrical contacts 377 may be pads, bumps, studs, pillars or posts. Some of the conductive bumps 20 may be disposed on the electrical contacts 377 of the bridge die 376. Thus, the first electronic device 24 and the second electronic device 26 are electrically connected to the embedded element (e.g., the bridge die 376). In addition, the first electronic device 24 and the second electronic device 26 are communicated with each other through the embedded element (e.g., the bridge die 376).

Figure 7:
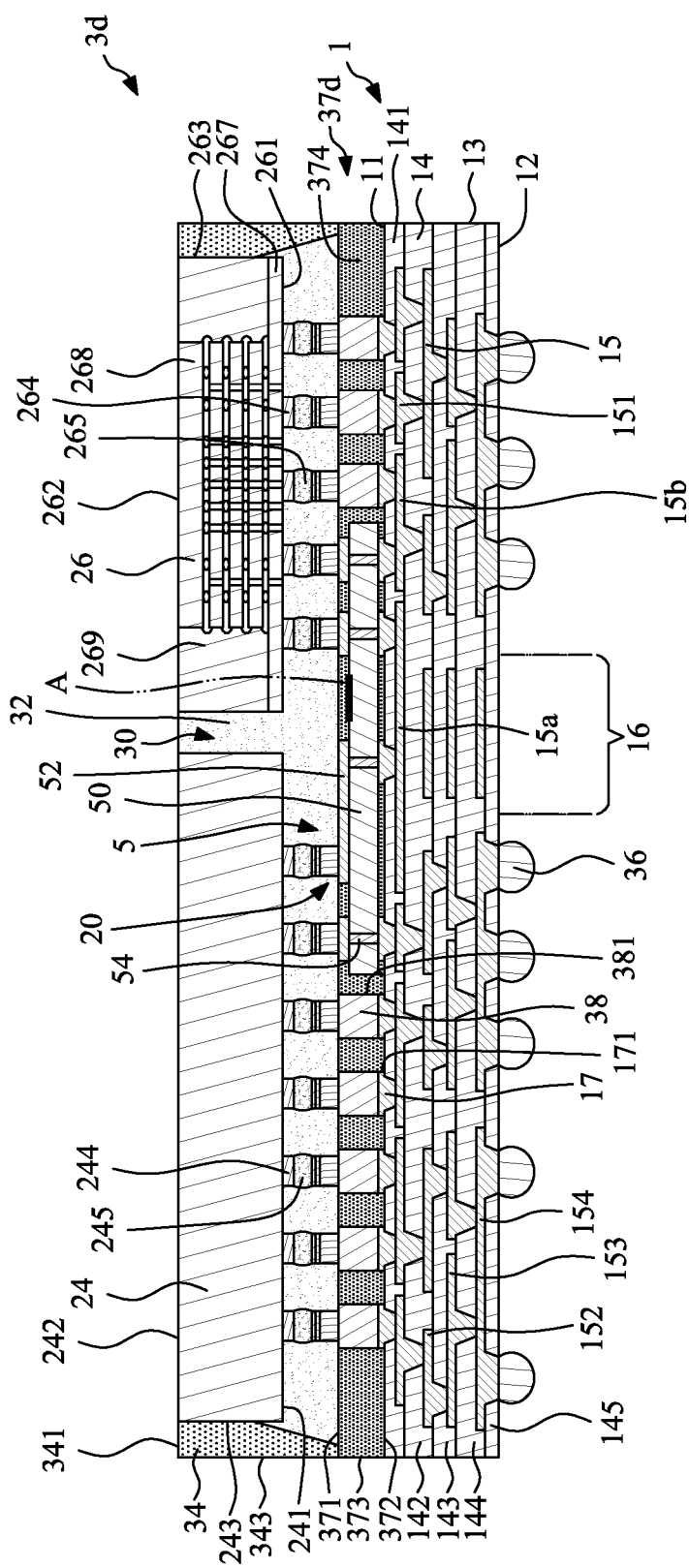
FIG. 7 illustrates a cross-sectional view of an example of a package structure according to some embodiments of the present disclosure.

FIG. 7 illustrates a cross-sectional view of an example of a package structure 3*d* according to some embodiments of the present disclosure. The package structure 3*d* of FIG. 7 is similar to the package structure 3*a* of FIG. 4, except for a structure of the reinforcement structure 37*d*. As shown in FIG. 7, the reinforcement structure 37*d* may include a main material 374 and at least one embedded element (e.g., an interposer 5) embedded in the main material 374. The main material 374 of FIG. 7 may be similar to the main material 374 of FIG. 4. The interposer 5 may be a silicon interposer or a glass interposer, and may be covered by the main material 374. As shown in FIG. 7, the interposer 5 may be attached to the first surface 11 of the wiring structure 1. In some embodiments, the interposer 5 may include a main body 50, a circuit layer 52 and a plurality of through vias 54. The circuit layer 52 may be disposed on the top surface of the main body 50. The top surface of the circuit layer 52 may be substantially coplanar with and/or exposed from the top surface of the main material 374 (e.g., the first surface 371 of the reinforcement structure 37*d*). The circuit layer 52 may include a plurality of pads and a plurality of traces. Some of the conductive bumps 20 may be disposed on the pads of the circuit layer 52 of the embedded element (e.g., the interposer 5). The through vias 54 may extend through the main body 50, and electrically connect the circuit layer 52 and the protrusion pad 17. Thus, the first electronic device 24 and the second electronic device 26 may be communicated with the wiring structure 1 through the embedded element (e.g., the interposer 5).

Figure 8:
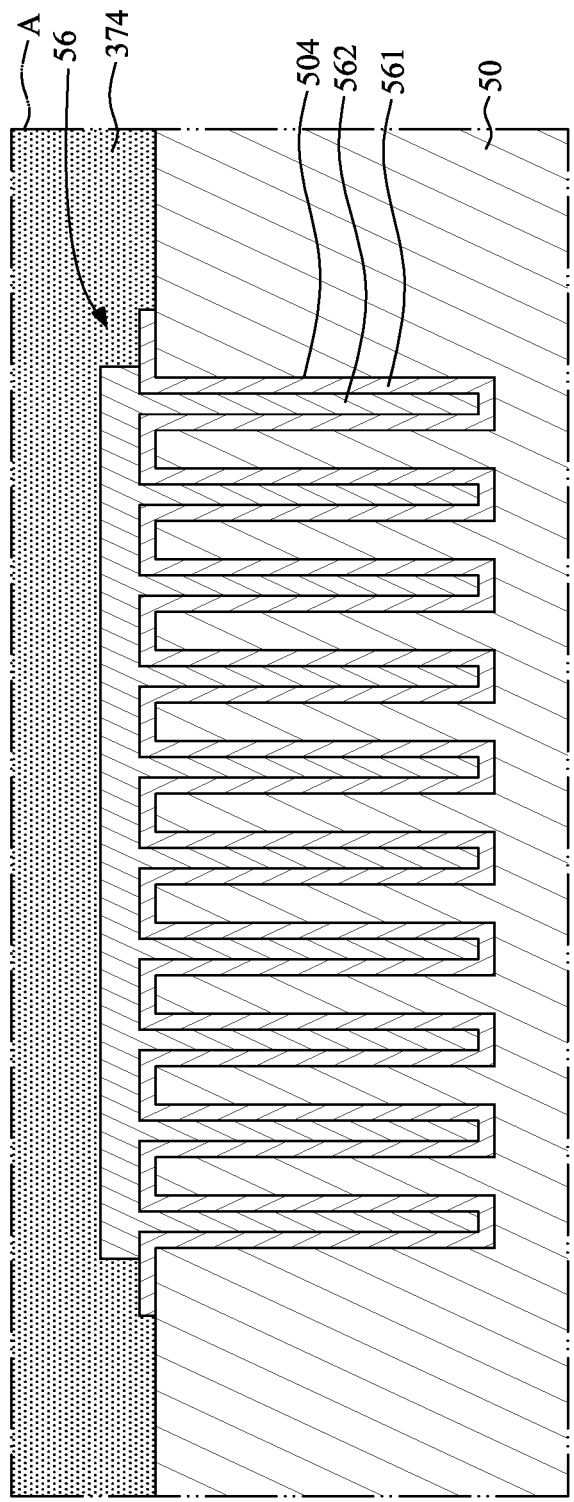
FIG. 8 illustrates an enlarged view of a region "A" in FIG. 7.

FIG. 8 illustrates an enlarged view of a region "A" in FIG. 7. The interposer 5 may include a trench capacitor 56 disposed adjacent to the top surface of the interposer 5. As shown in FIG. 8, the main body 50 may define a plurality of trenches 504. The trench capacitor 56 may include a dielectric layer 561 and a conductor 562. The dielectric layer 561 is disposed on the top surface of the interposer 5 and in the trenches 504. The dielectric layer 561 may not fill the trenches 504, and may define a central hole in each of the trenches 504. Portions of the conductor 562 may extend into the central holes defined by the dielectric layer 561 in the trenches 504. The conductor 562 above the top surface of the interposer 5 may be an electrode.

Figure 9:
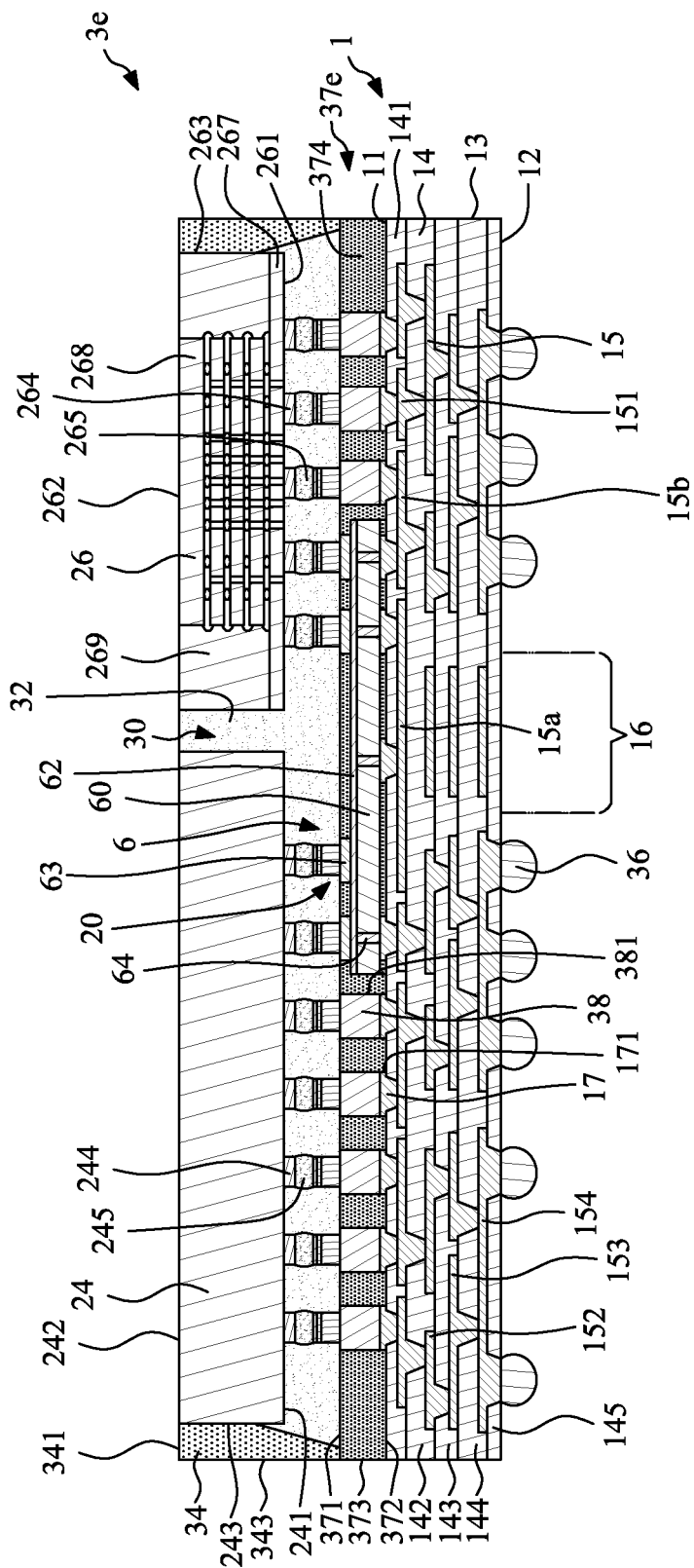
FIG. 9 illustrates a cross-sectional view of an example of a package structure according to some embodiments of the present disclosure.

FIG. 9 illustrates a cross-sectional view of an example of a package structure 3*e* according to some embodiments of the present disclosure. The package structure 3*e* of FIG. 9 is similar to the package structure 3*a* of FIG. 4, except for a structure of the reinforcement structure 37*e*. As shown in FIG. 9, the reinforcement structure 37*e* may include a main material 374 and at least one embedded element (e.g., an interconnection device 6) embedded in the main material 374. The main material 374 of FIG. 9 may be similar to the main material 374 of FIG. 4. The interconnection device 6 may be a silicon interconnection bridge, and may be covered by the main material 374. As shown in FIG. 9, the interposer 5 may be attached to the first surface 11 of the wiring structure 1. In some embodiments, the interconnection device 6 may include a main body 60, an active circuit area 62, a plurality of electrical contacts 63 and a plurality of through vias 64. The active circuit area 62 may be disposed on the top surface of the main body 60. The electrical contacts 63 may be disposed adjacent to the active circuit area 62. The top surfaces of the electrical contacts 63 may be substantially coplanar with and/or exposed from the top surface of the main material 374 (e.g., the first surface 371 of the reinforcement structure 37*e*). The electrical contacts 63 may be pads, bumps, studs, pillars or posts. Some of the conductive bumps 20 may be disposed on the electrical contacts 63 of the interconnection device 6. Thus, the first electronic device 24 and the second electronic device 26 are communicated with each other through the embedded element (e.g., the interconnection device 6). In addition, the through vias 64 may extend through the main body 60, and electrically connect the active circuit area 62 and the protrusion pad 17. Thus, the first electronic device 24 and the second electronic device 26 may be communicated with the wiring structure 1 through the embedded element (e.g., the interconnection device 6).

Figure 10:
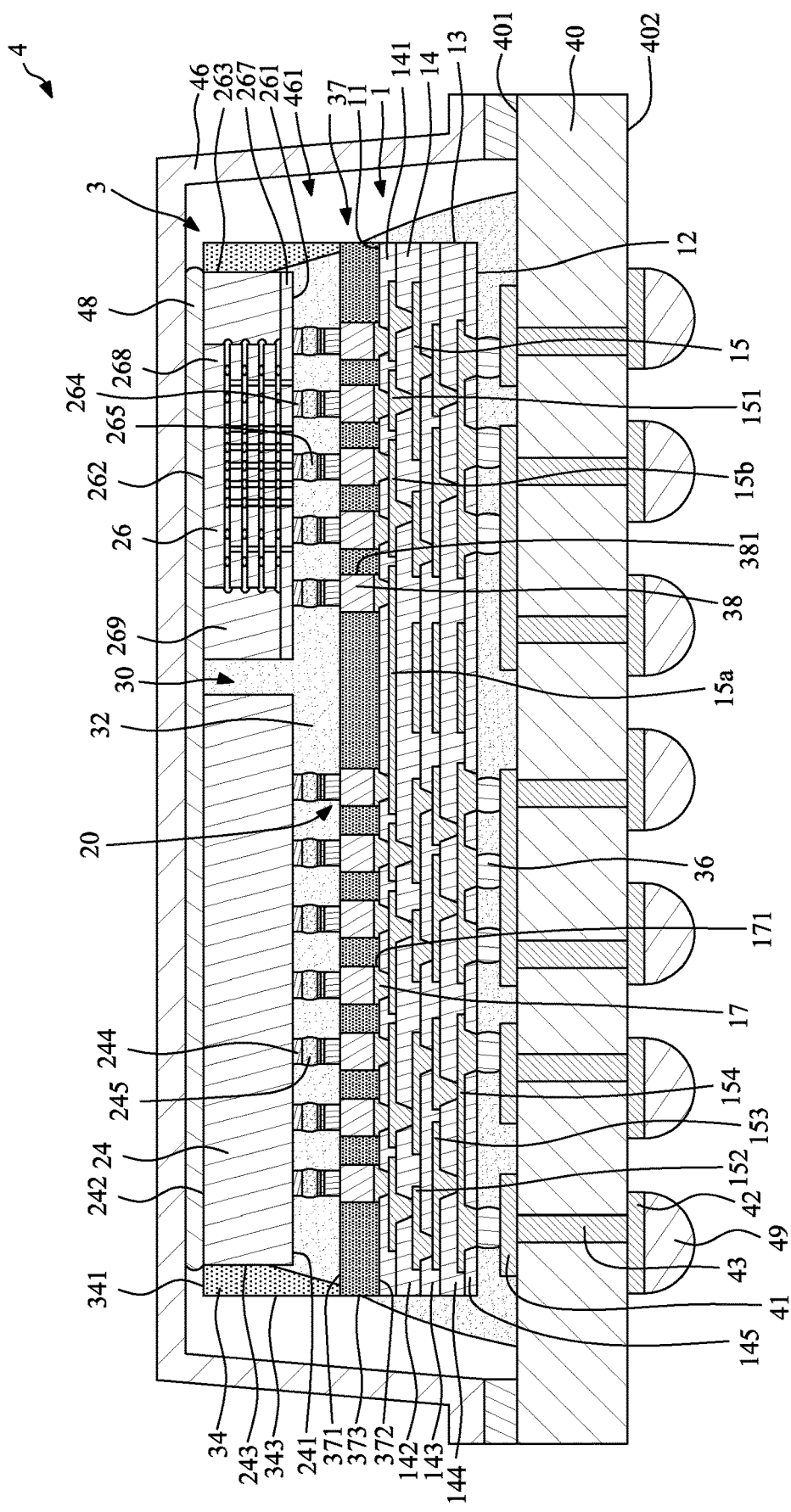
FIG. 10 illustrates a cross-sectional view of an assembly structure according to some embodiments of the present disclosure.

FIG. 10 illustrates a cross-sectional view of an assembly structure 4 according to some embodiments of the present disclosure. The assembly structure 4 may be a semiconductor package structure, and may include a base substrate 40, a package structure 3, a heat sink 46 and a plurality of external connectors 49. The base substrate 40 may include a glass reinforced epoxy material (such as FR4), bismaleimide triazine (BT), epoxy resin, silicon, printed circuit board (PCB) material, glass, ceramic or photoimageable dielectric (PID) material. The base substrate 40 may have a first surface 401 and a second surface 402 opposite to the first surface 401. As shown in FIG. 10, the base substrate 40 may include a first circuit layer 41, a second circuit layer 42, and a plurality of conductive vias 43. The first circuit layer 41 may be disposed adjacent to the first surface 401 of the base substrate 40, and the second circuit layer 42 may be disposed adjacent to the second surface 402 of the base substrate 40. The conductive vias 43 may extend through the base substrate 40 and electrically connect the first circuit layer 41 and the second circuit layer 42.

The package structure 3 of FIG. 10 may be same as or similar to the package structure 3 of FIG. 1 to FIG. 3. The package structure 3 may be electrically connected to the first circuit layer 41 of the base substrate 40 through the solder materials 36. A protection material (e.g., an underfill) may be further included in a space between the package structure 3 and the base substrate 40 so as to cover and protect the solder materials 36 and the first circuit layer 41. Further, the heat sink 46 may be a cap structure or a hat structure, and may define a cavity 461 for accommodating the package structure 3. A material of the heat sink 46 may include metal such as copper, aluminum, and/or other suitable material. A portion of the heat sink 46 may be attached to the top surface of the package structure 3 through a thermal material 48 (e.g., thermal interface material (TIM)) so as to dissipate the heat generated by the first electronic device 24 and the second electronic device 26. Another portion (e.g., bottom portion) of the heat sink 46 may be attached to the first surface 401 of the base substrate 40 through an adhesive material. In addition, the external connectors 49 (e.g., solder balls) are formed or disposed on the second circuit layer 42 for external connection. It is noted that the package structure 3 may be replaced by the package structures 3a, 3b, 3c, 3d, 3e of FIGS. 4, 5, 6, 7, 9.

During a manufacturing process, when the heat sink 46 is attached to the package structure 3, a pressing force may be transmitted from the heat sink 46 to the package structure 3. Since, the reinforcement structure 37 may increase the rigidity or stiffness of the wiring structure 1 and the package structure 3, a warpage of the wiring structure 1 and the package structure 3 may be reduced. Thus, the risk of formation of crack in the protection material 32 or the encapsulant 34 is low. However, if a crack is formed at the top surface of the protection material 32 in the gap 30 and extend or grow downward, it will be stopped by the reinforcement structure 37. Thus, the reinforcement structure 37 may prevent the crack from reaching the wiring structure 1, and may protect the interconnection portion 15a of the circuit layer 15 from being damaged or broken. Therefore, the reliability and yield of the assembly structure 4 is improved.

Figure 11:
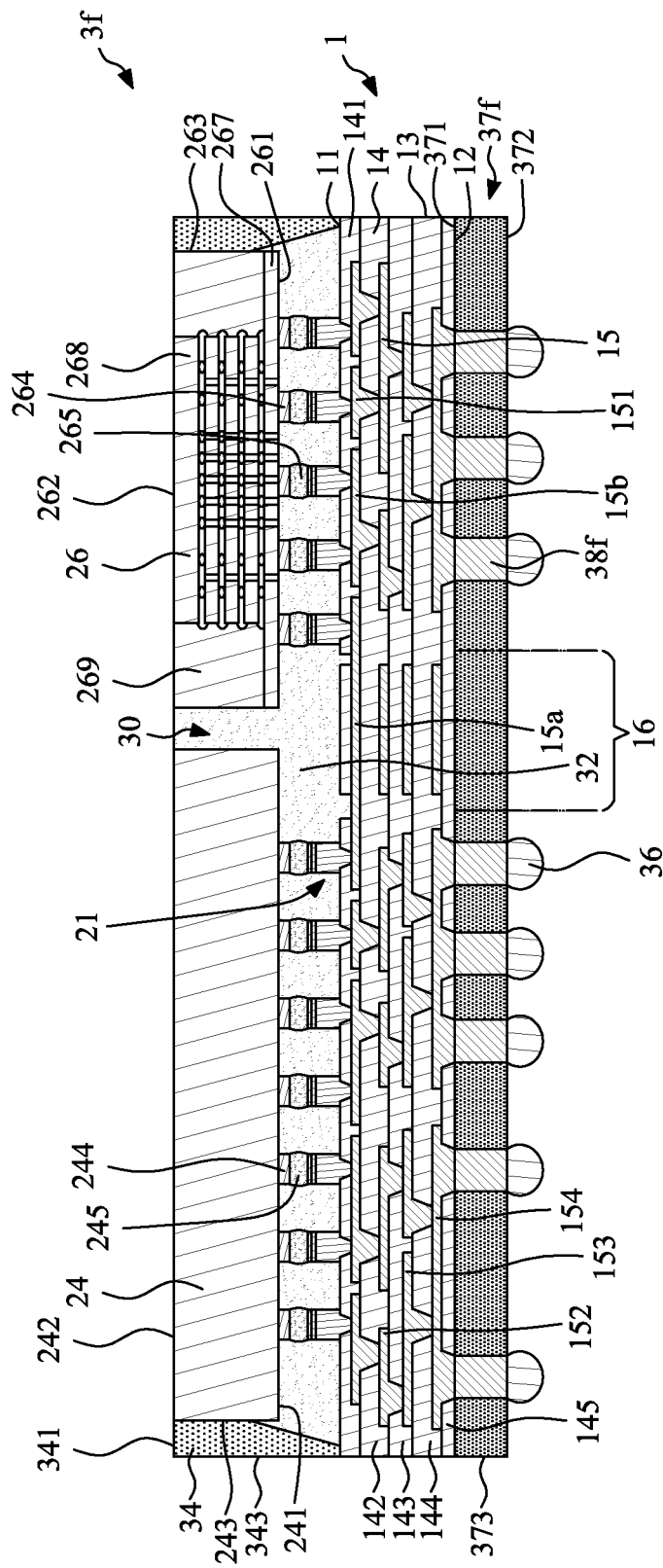
FIG. 11 illustrates a cross-sectional view of an example of a package structure according to some embodiments of the present disclosure.

FIG. 11 illustrates a cross-sectional view of an example of a package structure 3f according to some embodiments of the present disclosure. The package structure 3f of FIG. 11 is similar to the package structure 3 of FIG. 1 to FIG. 3, except for a position of the reinforcement structure 37f and structures of the protrusion pads 21. As shown in FIG. 11, the reinforcement structure 37f may be disposed on the second surface 12 of the wiring structure 1. The reinforcement structure 37f may have a first surface 371, a second surface 372 opposite to the first surface 371, and a lateral surface 373 extending between the first surface 371 and the second surface 372. A material and structure of the reinforcement structure 37f of FIG. 11 may be similar to the material and structure of the reinforcement structure 37 of FIG. 2 and FIG. 3. Further, the conductive vias 38f (or conductive pillars) may be disposed on the exposed portions (e.g., the bottom portions of the via portions) of the fourth circuit layer 154 of the wiring structure 1. The reinforcement structure 37f covers the conductive vias 38f. Thus, the conductive vias 38f may be disposed or embedded in the reinforcement structure 37f. In addition, the bottom surfaces of the conductive vias 38f may be substantially coplanar with the second surface 372 of the reinforcement structure 37f Thus, the bottom surfaces of the conductive vias 38f may be exposed from the second surface 372 of the reinforcement structure 37f. In addition, a size of the reinforcement structure 37f may be substantially equal to a size of the wiring structure 1 from a bottom view since the may be cut concurrently. Further, the lateral surface 373 of the reinforcement structure 37f may be substantially coplanar with the lateral surface 13 of the wiring structure 1. As shown in FIG. 11, the solder materials 36 may be disposed on the bottom surfaces of the conductive vias 38f.

In some embodiments, the protrusion pads 21 may be disposed on and protrude from the first dielectric layer 141 (e.g., the topmost dielectric layer or the outermost dielectric layer) of the wiring structure 1. The protrusion pads 21 may be disposed on and protrude from the first surface 11 of the wiring structure 1, and extend through the first dielectric layer 141 (e.g., the topmost dielectric layer or the outermost dielectric layer) to electrically connect the first circuit layer 151. In some embodiments, the first electrical contacts 244 of the first electronic device 24 may be electrically connected and physically connected to the protrusion pads 21 through a plurality of solder materials 245. The second electrical contacts 264 of the second electronic device 26 may be electrically connected and physically connected to the protrusion pads 21 through a plurality of solder materials 265. Thus, the first electronic device 24 and the second electronic device 26 may be bonded to and electrically connected to the first surface 11 of the wiring structure 1.

Figure 12:
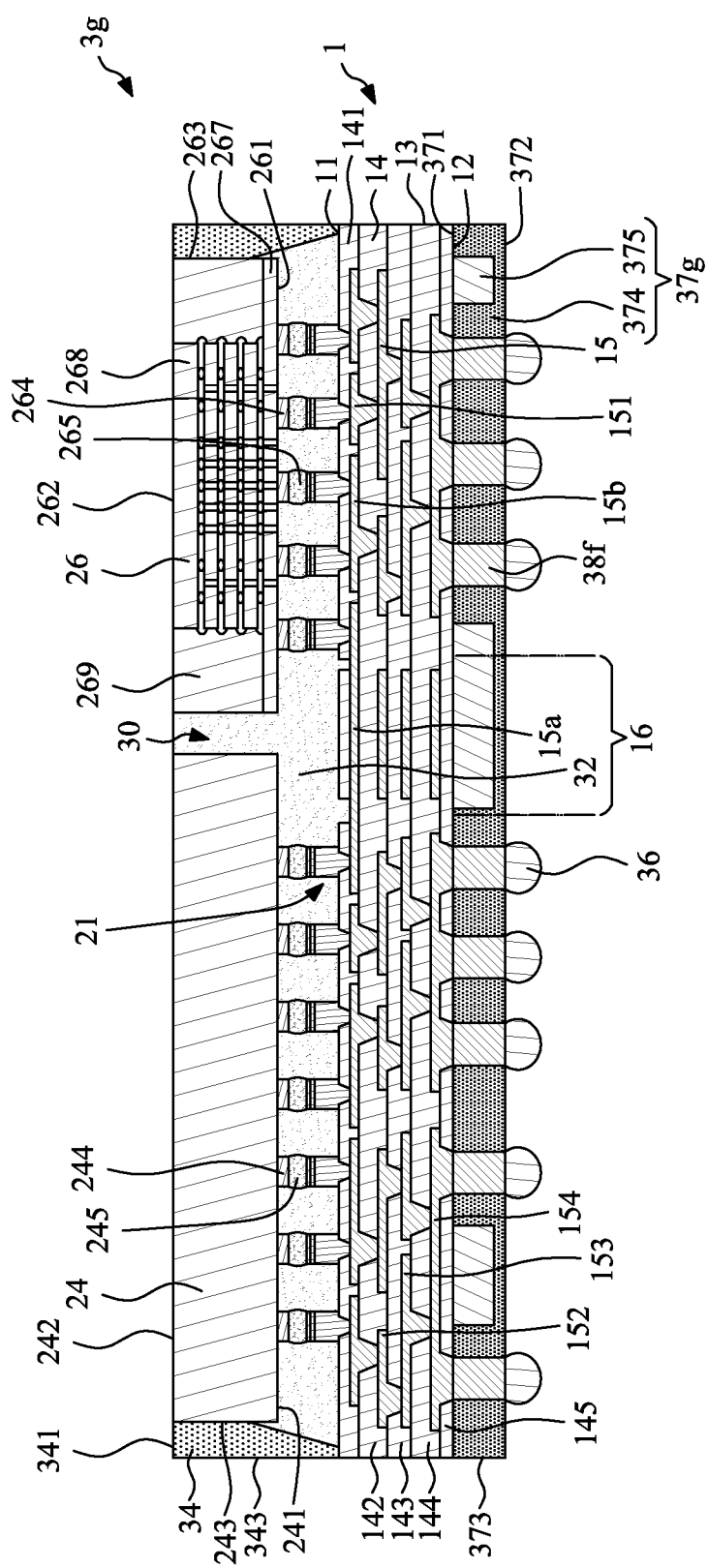
FIG. 12 illustrates a cross-sectional view of an example of a package structure according to some embodiments of the present disclosure.

FIG. 12 illustrates a cross-sectional view of an example of a package structure 3g according to some embodiments of the present disclosure. The package structure 3g of FIG. 12 is similar to the package structure 3f of FIG. 11, except for a structure of the reinforcement structure 37g. As shown in FIG. 12, the reinforcement structure 37g may include a main material 374 and at least one embedded element 375 embedded in the main material 374. The main material 374 may be similar to the reinforcement structure 37f of FIG. 11, and may be a thermoset material such as a thermoset polymer. The at least one embedded element 375 may be disposed on the second surface 12 of the wiring structure 1, and may be covered by the main material 374. In some embodiments, a material of the at least one embedded element 375 may be a dummy bulk including a silicon material or glass material. In some embodiments, the embedded element 375 may be a passive component (e.g., a capacitor), a bridge die, an interposer, or an interconnection device.

FIG. 13 through FIG. 23 illustrate a method for manufacturing an assembly structure according to some embodiments of the present disclosure. In some embodiments, the method is for manufacturing the package structure 3 shown in FIG. 1 to FIG. 3, and the assembly structure 4 of FIG. 10.

Figure 13:
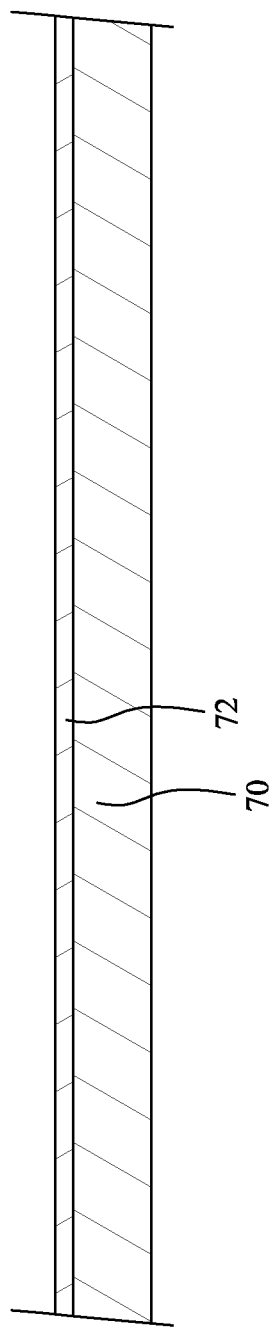
FIG. 13 illustrates one or more stages of an example of a method for manufacturing an assembly structure according to some embodiments of the present disclosure.

Referring to FIG. 13, a carrier 70 is provided. The carrier 70 may be in a wafer type or strip type. The carrier 70 may include a release layer 72 disposed thereon.

Figure 14:
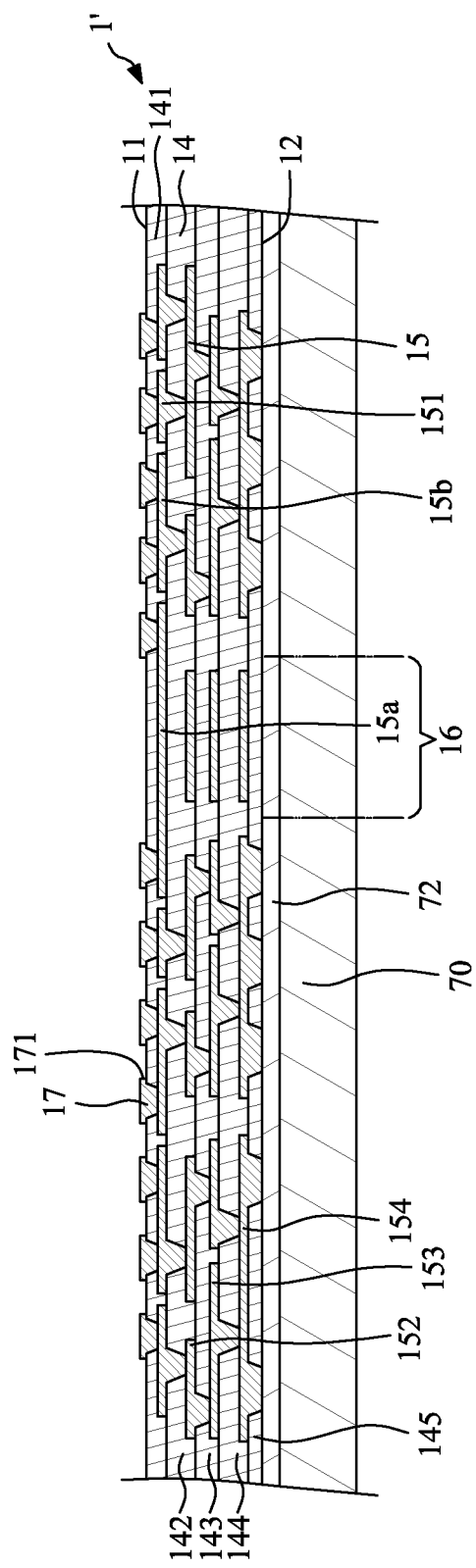
FIG. 14 illustrates one or more stages of an example of a method for manufacturing an assembly structure according to some embodiments of the present disclosure.

Referring to FIG. 14, a wiring structure 1' is formed or disposed on the release layer 72 on the carrier 70. The wiring structure 1' of FIG. 14 may be similar to the wiring structure 1 of FIG. 2, and may have a first surface 11, a second surface 12 opposite to the first surface 11, and a high density region 16 (or a fine line region). The wiring structure 1' may include at least one dielectric layer 14, at least one circuit layer 15 in contact with the dielectric layer 14 and a plurality of protrusion pads 17. The protrusion pads 17 may be disposed on and protrude from the first dielectric layer 141 (e.g., the topmost dielectric layer or the outermost dielectric layer) of the wiring structure 1'. The protrusion pads 17 may be disposed on and protrude from the first surface 11 of the wiring structure 1', and extend through the first dielectric layer 141 (e.g., the topmost dielectric layer or the outermost dielectric layer) to electrically connect the first circuit layer 151. Each of the protrusion pads 17 may include a periphery side surface 171.

Figure 15:
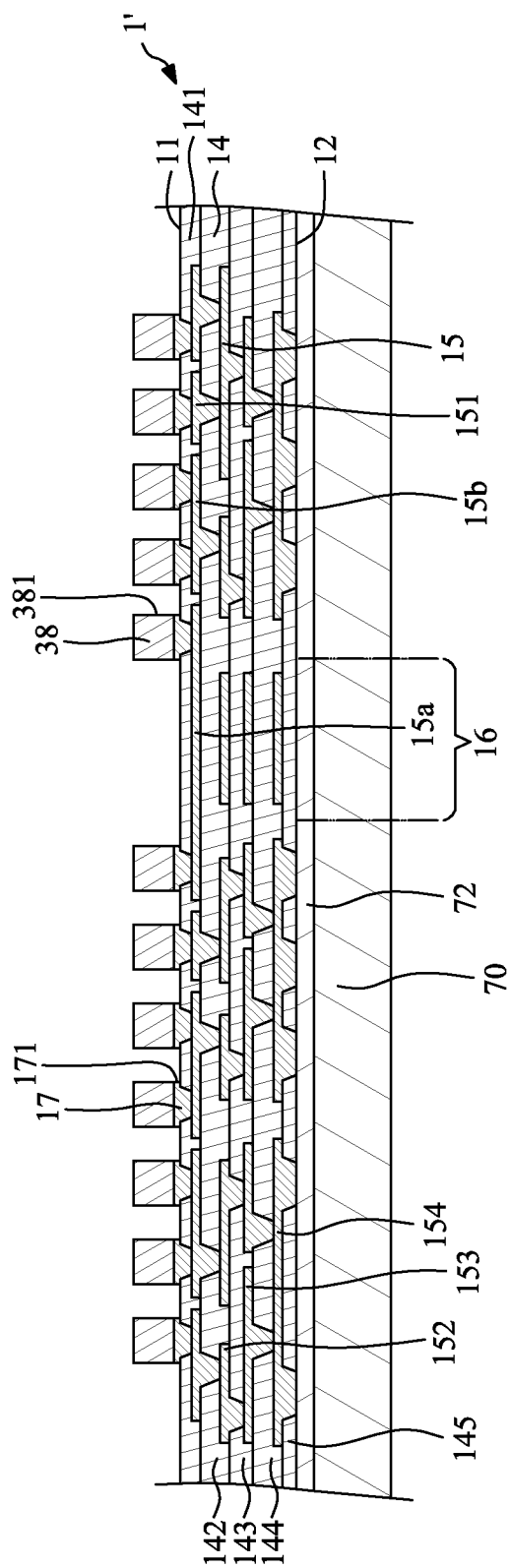
FIG. 15 illustrates one or more stages of an example of a method for manufacturing an assembly structure according to some embodiments of the present disclosure.

Referring to FIG. 15, a plurality of conductive pillars (or conductive vias 38) are formed or disposed on the protrusion pads 17 of the wiring structure 1' through, for example, plating. Each of the conductive pillars (or conductive vias 38) may have a periphery side surface 381. In some embodiments, the periphery side surface 381 of the conductive pillar (or conductive via 38) may be substantially coplanar with the periphery side surface 171 of the protrusion pad 17.

Figure 16:
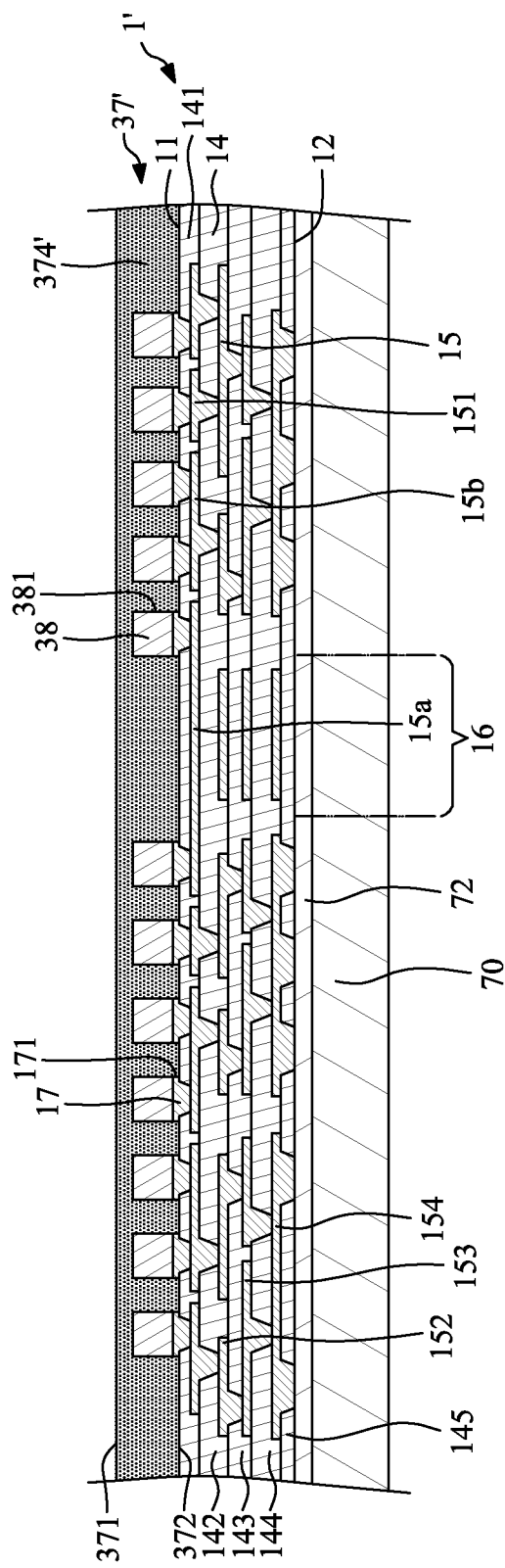
FIG. 16 illustrates one or more stages of an example of a method for manufacturing an assembly structure according to some embodiments of the present disclosure.

Referring to FIG. 16, a main material 374' or a reinforcement structure 37' may be formed or disposed on the first surface 11 of the wiring structure 1' to cover the periphery side surfaces 381 of the conductive pillars (or conductive vias 38) and the periphery side surfaces 171 of the protrusion pads 17. In some embodiments, the main material 374' or the reinforcement structure 37' may include a thermoset material such as a thermoset polymer. In some embodiments, the main material 374' or the reinforcement structure 37' may be a molding compound. The molding compound may include a resin material with or without fillers, and may be formed by a molding process and a curing process. The second surface 372 of the main material 374' or the reinforcement structure 37' may contact the first surface 11 of the wiring structure 1' directly, and may be lower than the top surface of the protrusion pads 17. That is, the conductive pillars (or conductive vias 38) and at least a portion of the protrusion pad 17 may be disposed or embedded in the main material 374' or the reinforcement structure 37'.

Figure 17:
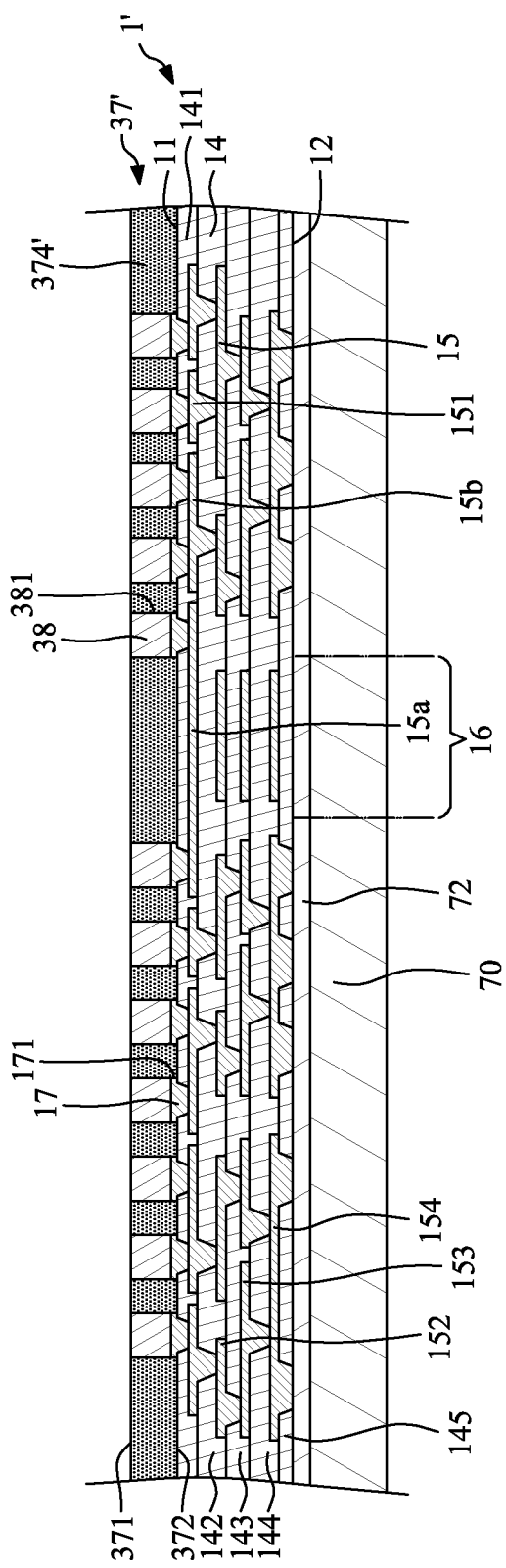
FIG. 17 illustrates one or more stages of an example of a method for manufacturing an assembly structure according to some embodiments of the present disclosure.

Referring to FIG. 17, the main material 374' or the reinforcement structure 37' may be thinned by, for example, grinding. Thus, the top surfaces of the conductive pillars (or conductive vias 38) may be substantially coplanar with the first surface 371 of the main material 374' or the reinforcement structure 37', and one end (e.g., the top surface) of each of the conductive pillars (or conductive vias 38) may be exposed from the first surface 371 of the main material 374' or the reinforcement structure 37'. Meanwhile, the conductive pillars become the conductive vias 38 embedded in the main material 374' or the reinforcement structure 37'.

Figure 18:
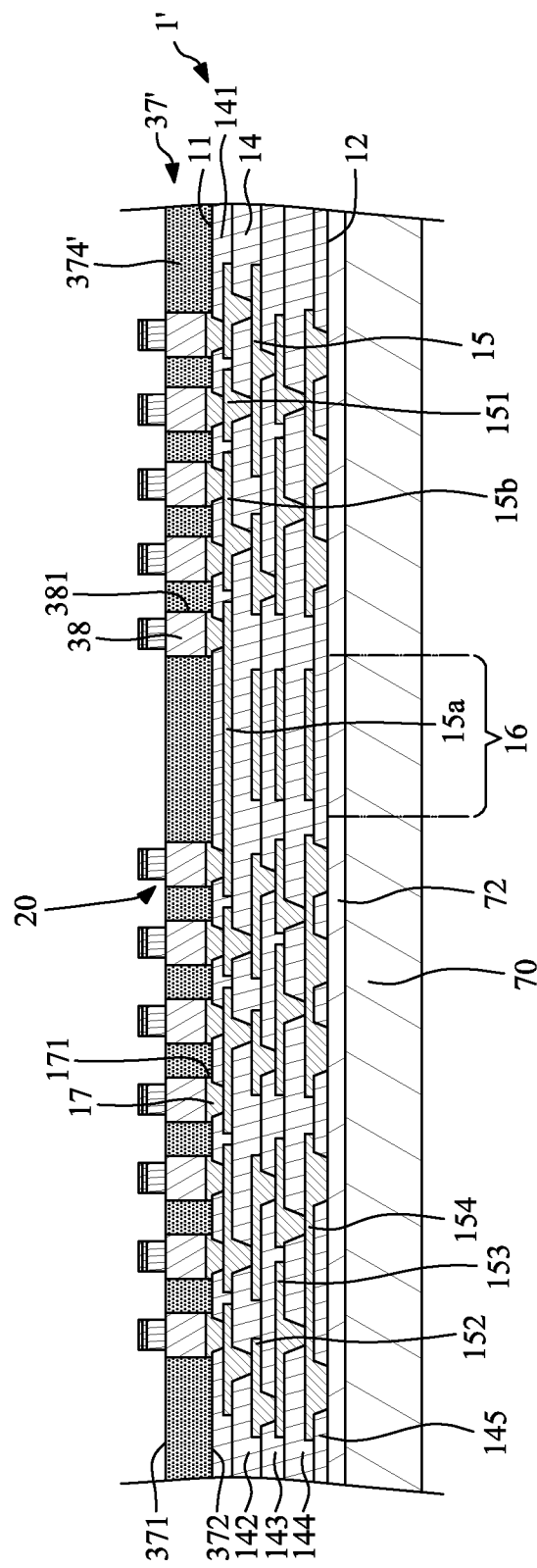
FIG. 18 illustrates one or more stages of an example of a method for manufacturing an assembly structure according to some embodiments of the present disclosure.

Referring to FIG. 18, a plurality of conductive bumps 20 may be formed or disposed on the first surface 371 of the reinforcement structure 37'. In some embodiments, the conductive bumps 20 may be formed or disposed on the top surfaces of the conductive vias 38.

Figure 19:
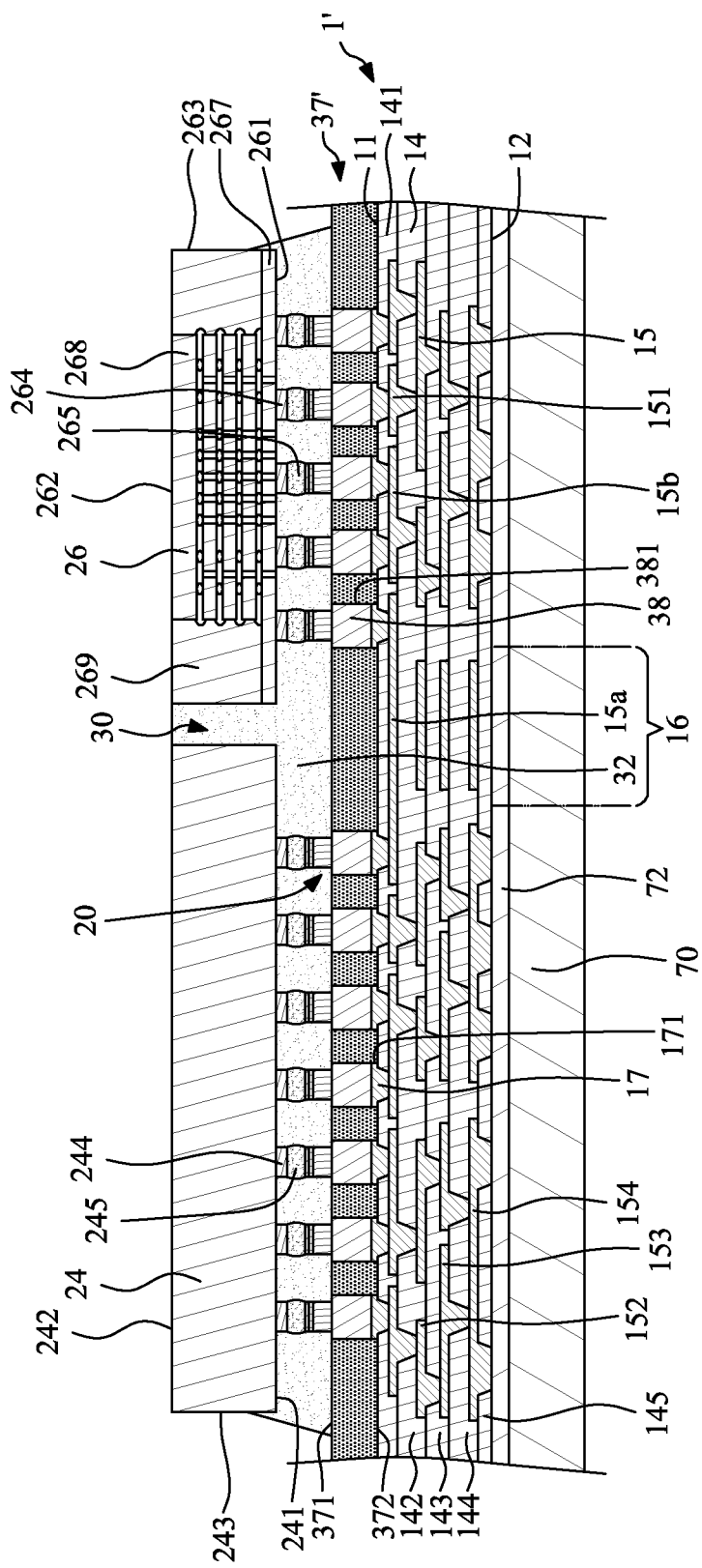
FIG. 19 illustrates one or more stages of an example of a method for manufacturing an assembly structure according to some embodiments of the present disclosure.

Referring to FIG. 19, the first electronic device 24 and the second electronic device 26 are bonded to and electrically connected to the conductive bumps 20. Thus, the first electronic device 24 and the second electronic device 26 are disposed adjacent to the first surface 371 of the reinforcement structure 37' side by side, and are electrically connected to the conductive vias 38 of the reinforcement structure 37' and the circuit layer 15 of the wiring structure 1'.

The first electronic device 24 may have a first active surface 241, a first backside surface 242 opposite to the first active surface 241, and a lateral surface 243 extending between the first active surface 241 and the first backside surface 242. Further, the first electronic device 24 may include a plurality of first electrical contacts 244 disposed adjacent to the first active surface 241. In some embodiments, the first electrical contacts 244 of the first electronic device 24 may be electrically connected and physically connected to the first protrusion pads 21 through a plurality of solder materials 245. The second electronic device 26 may have a second active surface 261, a second backside surface 262 opposite to the second active surface 261, and a lateral surface 263 extending between the second active surface 261 and the second backside surface 262. Further, the second electronic device 26 may include a plurality of second electrical contacts 264 disposed adjacent to the second active surface 261. In some embodiments, the second electrical contacts 264 of the second electronic device 26 may be electrically connected and physically connected to the second protrusion pads 22 through a plurality of solder materials 265.

Then, a protection material 32 (e.g., an underfill) may be formed or disposed in a space between the first electronic device 24 and the reinforcement structure 37' so as to cover and protect the joints formed by the first electrical contacts 244, the conductive bumps 20 and the solder materials 245. Further, the protection material 32 may be disposed in a space between the second electronic device 26 and the reinforcement structure 37' so as to cover and protect the joints formed by the second electrical contacts 264, the conductive bumps 20 and the solder materials 265. In addition, the protection material 32 may further extend into a gap 30 between the lateral surface 243 of the first electronic device 24 and the lateral surface 263 of the second electronic device 26.

Figure 20:
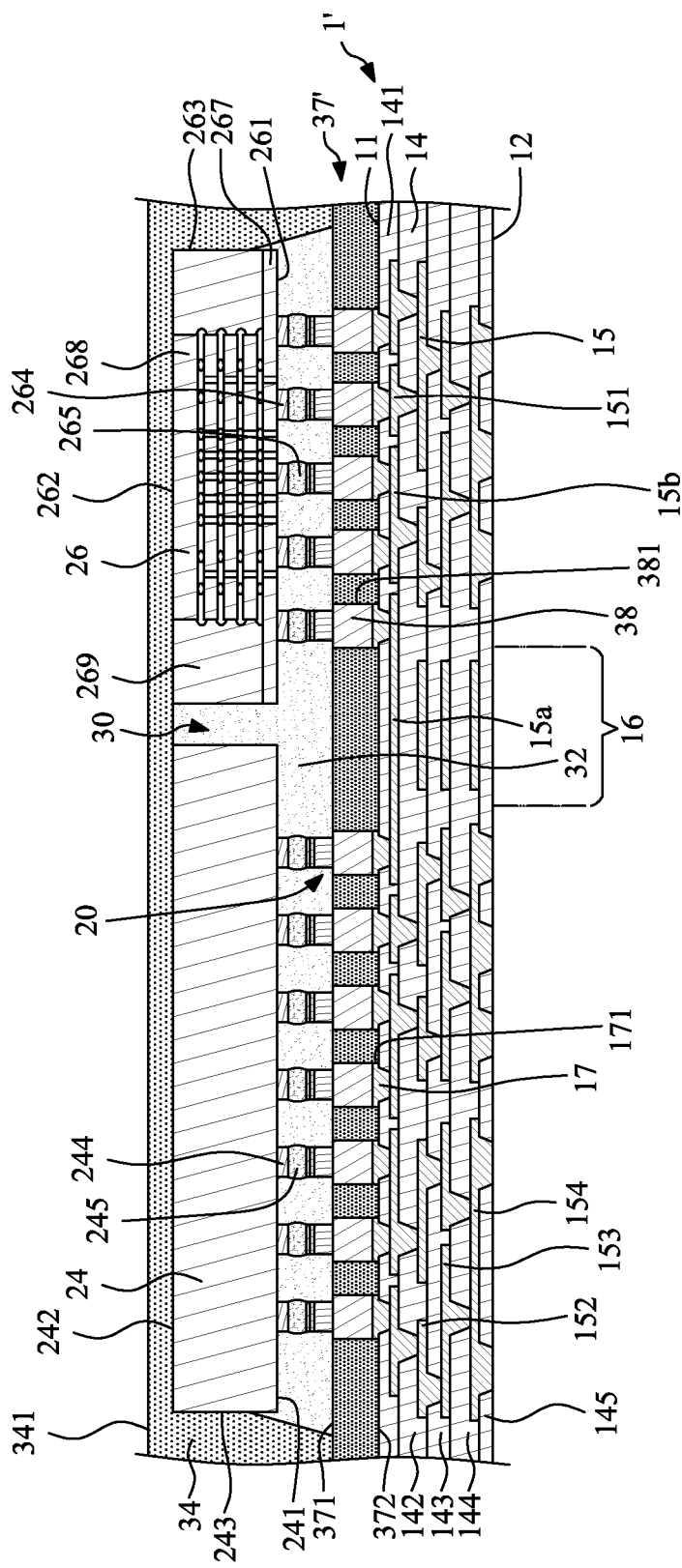
FIG. 20 illustrates one or more stages of an example of a method for manufacturing an assembly structure according to some embodiments of the present disclosure.

Referring to FIG. 20, an encapsulant 34 is formed or disposed to cover at least a portion of the first surface 371 of the reinforcement structure 37', at least a portion of the first electronic device 24, at least a portion of the second electronic device 26 and the protection material 32. The encapsulant 34 has a first surface 341 (e.g., a top surface). Then, the carrier 50 and the release layer 52 are removed. Thus, portions (e.g., the bottom portions of the via portions) of the fourth circuit layer 154 are exposed from the second surface 12 of the wiring structure 1'.

Figure 21:
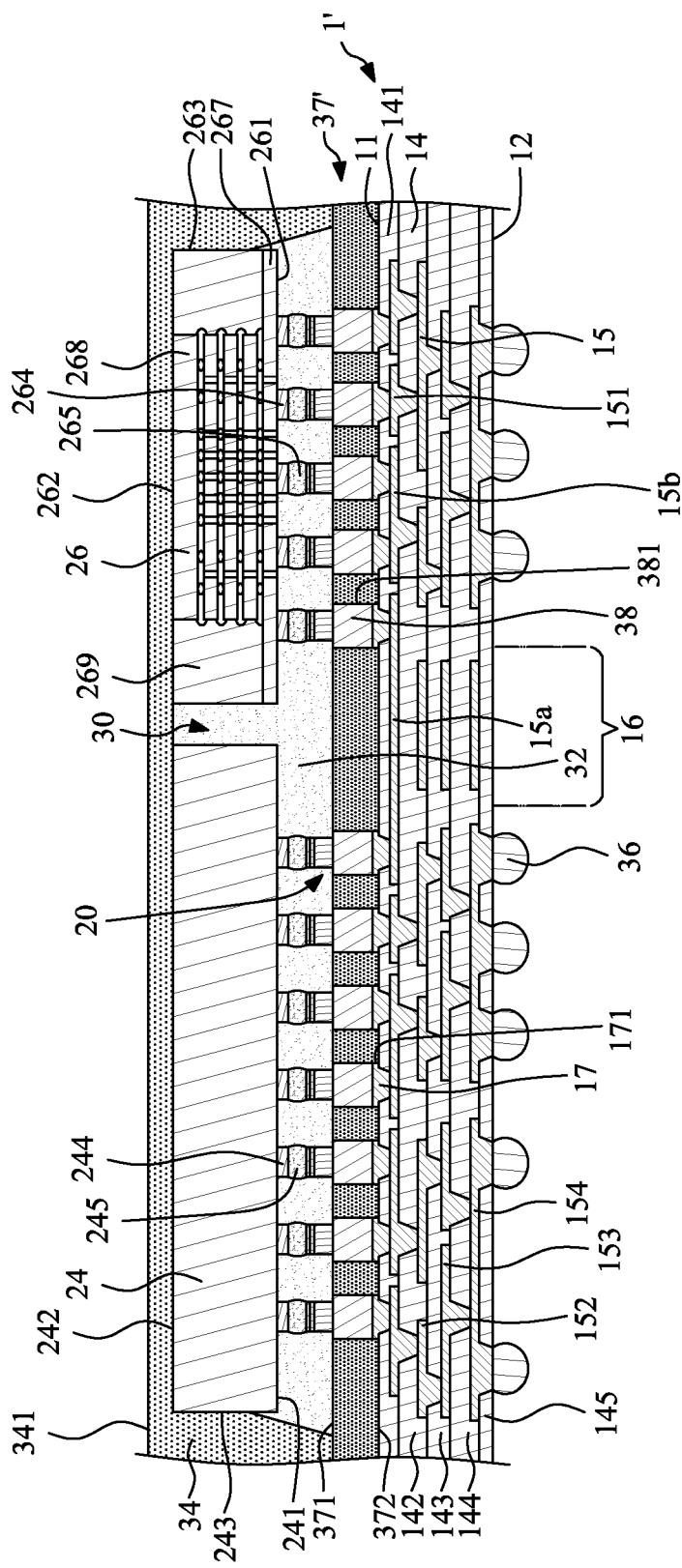
FIG. 21 illustrates one or more stages of an example of a method for manufacturing an assembly structure according to some embodiments of the present disclosure.

Referring to FIG. 21, a plurality of solder materials 36 (e.g., solder balls) are formed or disposed to the second surface 12 of the wiring structure 1'. As shown in FIG. 21, the solder materials 36 are disposed on the exposed portions (e.g., the bottom portions of the via portions) of the fourth circuit layer 154.

Figure 22:
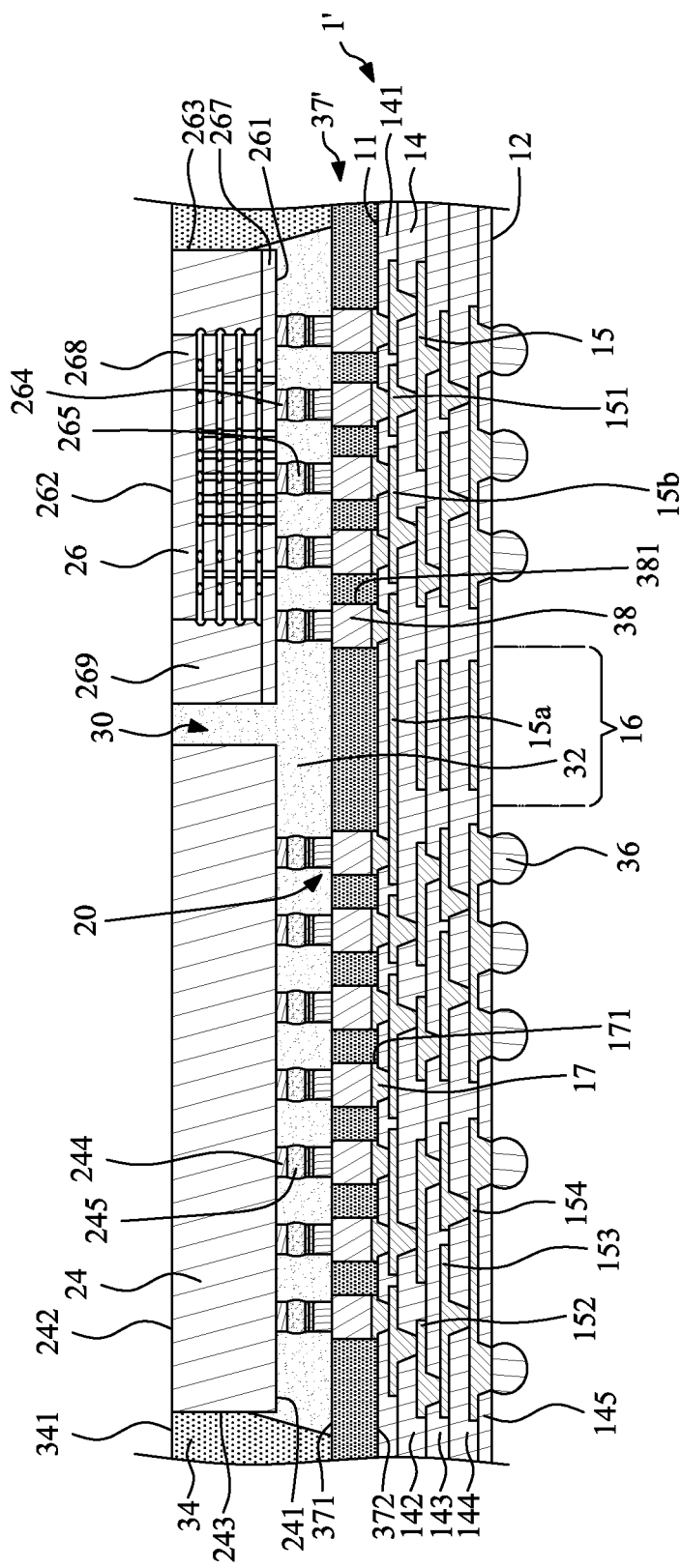
FIG. 22 illustrates one or more stages of an example of a method for manufacturing an assembly structure according to some embodiments of the present disclosure.

Referring to FIG. 22, the encapsulant 34 is thinned from its first surface 341. Thus, the first surface 341 of the encapsulant 34, the first backside surface 242 of the first electronic device 24, the second backside surface 262 of the second electronic device 26 and a top surface of the protection material 32 in the gap 30 may be substantially coplanar with each other.

In some embodiments, a singulation process may be conducted to cut the encapsulant 34, the reinforcement structure 37' and the wiring structure 1' so as to obtain a plurality of package structures 3 shown in FIG. 1 to FIG. 3.

Figure 23:
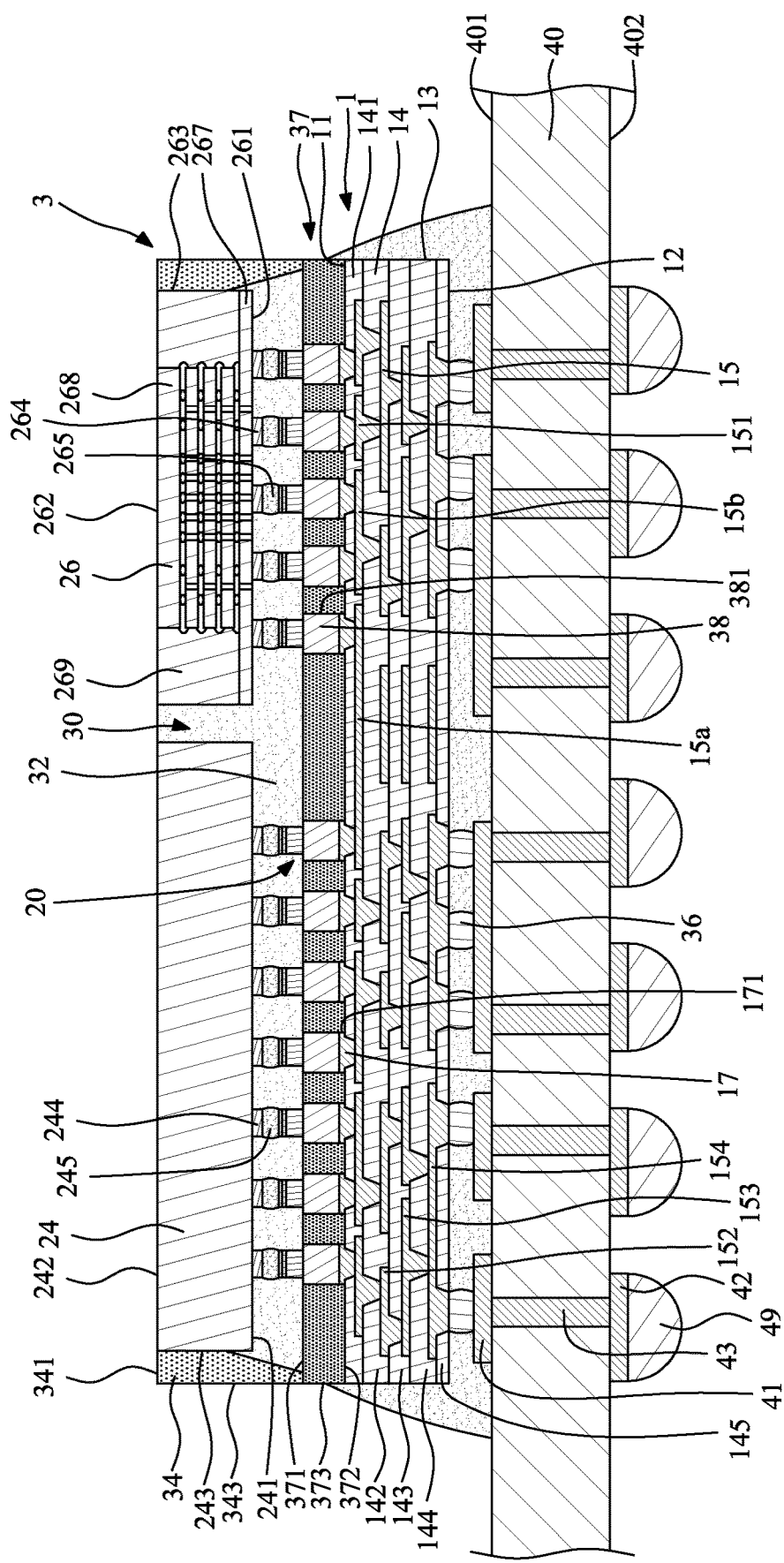
FIG. 23 illustrates one or more stages of an example of a method for manufacturing an assembly structure according to some embodiments of the present disclosure.

Referring to FIG. 23, the package structure 3 may be electrically connected to a first circuit layer 41 of a base substrate 40 through the solder materials 36. The base substrate 40 may have a first surface 401 and a second surface 402 opposite to the first surface 401. The base substrate 40 may include a first circuit layer 41, a second circuit layer 42, and a plurality of conductive vias 43. The first circuit layer 41 may be disposed adjacent to the first surface 401 of the base substrate 40, and the second circuit layer 42 may be disposed adjacent to the second surface 402 of the base substrate 40. The conductive vias 43 may extend through the base substrate 40 and electrically connect the first circuit layer 41 and the second circuit layer 42.

Then, a protection material (e.g., an underfill) may be formed or disposed in a space between the package structure 3 and the base substrate 40 so as to cover and protect the solder materials 36 and the first circuit layer 41.

Then, a heat sink 46 may be attached to the first electronic device 24, the second electronic device 26 and the base substrate 40. In some embodiments, the heat sink 46 may be a cap structure or a hat structure, and may define a cavity 461 for accommodating the package structure 3. A portion of the heat sink 46 may be attached to the top surface of the package structure 3 through a thermal material 48 (e.g., thermal interface material (TIM)). Another portion (e.g., bottom portion) of the heat sink 46 may be attached to the base substrate 40 through an adhesive material. Then, a plurality of external connectors 49 (e.g., solder balls) may be formed or disposed on the second circuit layer 42 for external connection.

Then, a singulation process may be conducted to cut the base substrate 40 so as to obtain a plurality of assembly structures 4 shown in FIG. 10.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
    a wiring structure including at least one dielectric layer and at least one circuit layer in contact with the dielectric layer;
    at least one electronic device electrically connected to the wiring structure;
    a reinforcement structure disposed on a surface of the wiring structure, and including a thermoset material;
    a plurality of conductive vias disposed in the reinforcement structure; and
    an encapsulant covering the at least one electronic device.

2. The package structure of claim 1, further comprising an underfill disposed between the at least one electronic device and the reinforcement structure.

3. The package structure of claim 2, wherein the underfill contacts the reinforcement structure directly.

4. The package structure of claim 1, wherein the reinforcement structure contacts the wiring structure directly.

5. The package structure of claim 1, wherein the reinforcement structure substantially covers the wiring structure.

6. The package structure of claim 1, wherein a lateral surface of the reinforcement structure is substantially coplanar with a lateral surface of the wiring structure.

7. The package structure of claim 1, wherein the wiring structure has a first surface and a second surface opposite to the first surface, the reinforcement structure is disposed on the first surface of the wiring structure, and the at least one electronic device is electrically connected to the wiring structure through the conductive vias.

8. The package structure of claim 1, wherein the wiring structure has a first surface and a second surface opposite to the first surface, the at least one electronic device is bonded to and electrically connected to the first surface of the wiring structure, and the reinforcement structure is disposed on the second surface of the wiring structure.

9. The package structure of claim 1, wherein the reinforcement structure includes a main material and at least one embedded element embedded in the main material.

10. The package structure of claim 9, wherein the main material includes a molding compound.

11. The package structure of claim 9, wherein a material of the main material is the same as a material of the encapsulant.

12. The package structure of claim 9, wherein the at least one embedded element is a passive component.

13. The package structure of claim 9, wherein the at least one embedded element is electrically connected to the wiring structure.

14. The package structure of claim 9, wherein the at least one electronic device includes a first electronic device and a second electronic device disposed side by side, and the first electronic device and the second electronic device are electrically connected to the at least one embedded element.

15. The package structure of claim 1, further comprising a plurality of protrusion pads disposed on and protruding from the surface of the wiring structure, and the reinforcement structure covers a periphery side surface of the protrusion pad.

16. A manufacturing method, comprising:
   (a) providing a wiring structure, wherein the wiring structure includes at least one dielectric layer and at least one circuit layer in contact with the dielectric layer;
   (b) forming a reinforcement structure on the wiring structure, wherein the reinforcement structure includes a plurality of conductive vias disposed therein; and
   (c) electrically connecting at least one electronic device to the conductive vias of the reinforcement structure.

17. The manufacturing method of claim 16, wherein in (b), the reinforcement structure is a molding compound and is formed by a molding process.

18. The manufacturing method of claim 16, wherein (b) includes:
   (b1) forming a plurality of pillars on the wiring structure;
   (b2) forming a main material on the wiring structure to cover the pillars, wherein one end of each of the pillars is exposed from the main material to form the conductive vias.

19. The manufacturing method of claim 16, wherein after (b), the method further includes:
   (b1) forming a plurality of conductive bumps on the conductive vias;
   wherein in (c), the at least one electronic device is bonded to and electrically connected to the conductive bumps;
   wherein after (c), the method further includes:
   (d) forming an underfill between the at least one electronic device and the reinforcement structure to cover the conductive bumps.

20. The manufacturing method of claim 16, wherein after (c), the method further includes:
   (d) forming an underfill between the at least one electronic device and the reinforcement structure; and
   (e) forming an encapsulant to cover the underfill and the at least one electronic device.

* * * * *